US012707688B2

(12) United States Patent
Chang

(10) Patent No.: US 12,707,688 B2
(45) Date of Patent: Aug. 11, 2026

(54) SEMICONDUCTOR STRUCTURE WITH ROUGHENED SIDEWALL AND METHOD OF MANUFACTURING THEREOF

(71) Applicant: TAIWAN SEMICONDUCTOR MANUFACTURING COMPANY LTD., Hsinchu (TW)

(72) Inventor: Jen-Yuan Chang, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 621 days.

(21) Appl. No.: 17/821,165

(22) Filed: Aug. 20, 2022

(65) Prior Publication Data

US 2024/0063272 A1 Feb. 22, 2024

(51) Int. Cl.
*H10D 62/50* (2025.01)
*H10W 90/00* (2026.01)

(52) U.S. Cl.
CPC ............ *H10D 62/50* (2025.01); *H10W 90/00* (2026.01); *H10W 90/732* (2026.01)

(58) Field of Classification Search
CPC ... H10W 42/00; H10W 72/30; H10W 74/127; H10W 74/137; H10W 74/141; H10W 74/147
See application file for complete search history.

(56) References Cited

U.S. PATENT DOCUMENTS

| | | | | |
|---|---|---|---|---|
| 8,802,504 | B1 | 8/2014 | Hou et al. | |
| 8,803,292 | B2 | 8/2014 | Chen et al. | |
| 8,803,316 | B2 | 8/2014 | Lin et al. | |
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,496,189 | B2 | 11/2016 | Yu et al. | |
| 2008/0026318 | A1* | 1/2008 | Schultz | H01L 24/11 430/311 |
| 2020/0279813 | A1* | 9/2020 | Liff | H01L 24/19 |
| 2020/0312783 | A1* | 10/2020 | Min | H01L 23/49833 |
| 2021/0057328 | A1* | 2/2021 | Lee | H01L 21/78 |
| 2022/0108932 | A1* | 4/2022 | Liu | H01L 25/0652 |

* cited by examiner

*Primary Examiner* — Fazli Erdem
(74) *Attorney, Agent, or Firm* — WPAT LAW; Anthony King

(57) ABSTRACT

A semiconductor structure includes a die structure including: a substrate having a sidewall; a dielectric disposed over the substrate; an interconnect structure disposed within the dielectric; and a capping member surrounding the die structure, wherein the sidewall of the substrate includes a plurality of recesses extending into the substrate, and each of the plurality of recesses surrounds at least a portion of the capping member.

20 Claims, 25 Drawing Sheets

SEMICONDUCTOR STRUCTURE WITH ROUGHENED SIDEWALL AND METHOD OF MANUFACTURING THEREOF

BACKGROUND

The semiconductor industry has experienced rapid growth due to ongoing improvements in the integration density of a variety of electrical components. To accommodate the miniaturized scale of the semiconductor device, various technologies and applications have been developed for the wafer-level packaging, involving greater numbers of different components with different functions. Improvement in integration density has resulted from iterative reduction of minimum feature size, which allows more components to be integrated into a given area.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
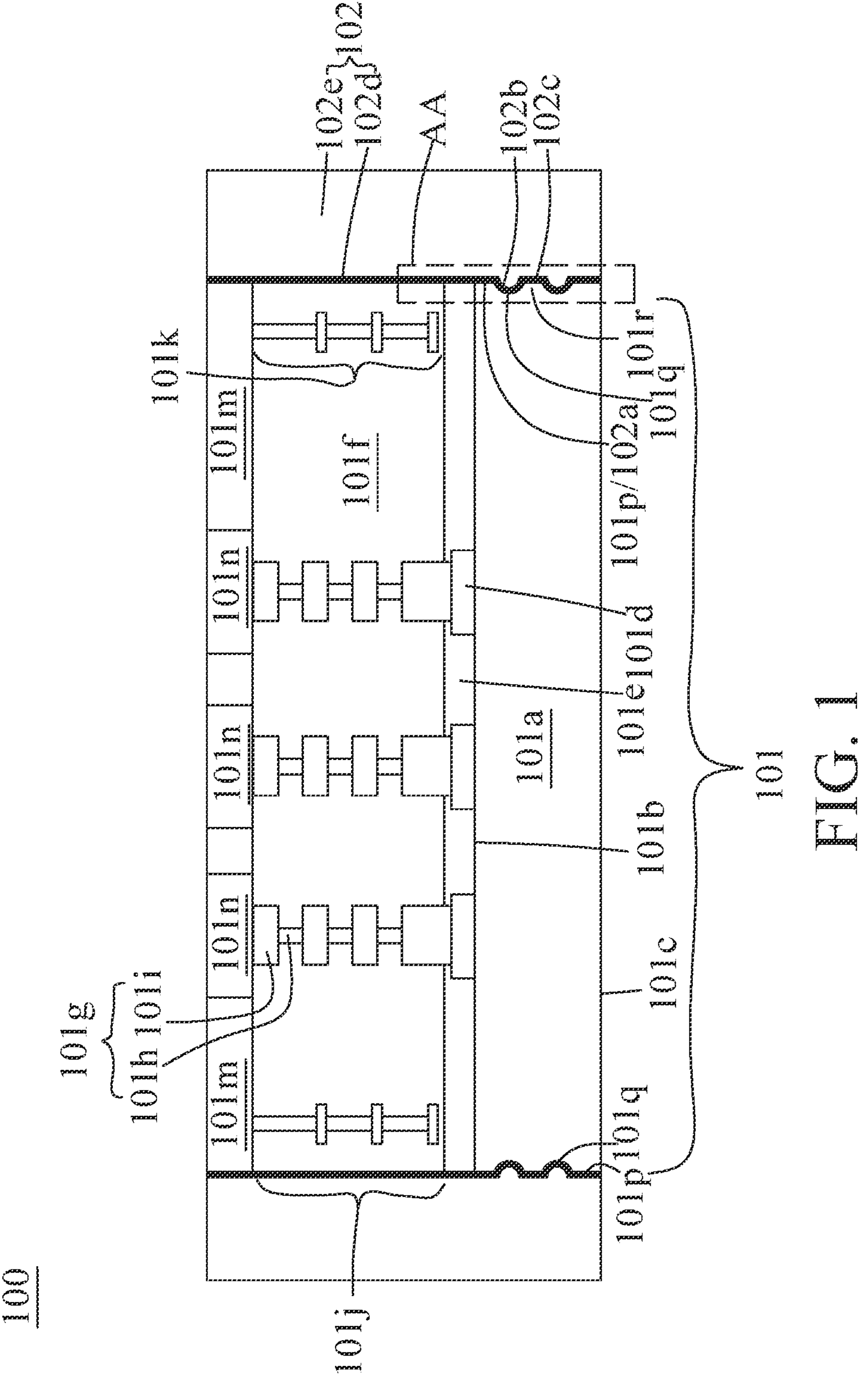
FIG. 1 is a cross-sectional view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “upper,” “on” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as “first,” “second” and “third” describe various elements, components, regions, layers and/or sections, these elements, components, regions, layers and/or sections should not be limited by these terms. These terms may be only used to distinguish one element, component, region, layer or section from another. The terms such as “first,” “second” and “third” when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms “substantially,” “approximately” and “about” generally mean within a value or range that can be contemplated by people having ordinary skill in the art. Alternatively, the terms “substantially,” “approximately” and “about” mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms “substantially,” “approximately” or “about.” Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In the present disclosure, a semiconductor structure and a method of manufacturing a semiconductor structure are provided. The semiconductor structure includes a die structure having a roughened sidewall covered by a capping member. Other features and processes may also be included. In some embodiments, the method of manufacturing the semiconductor structure includes forming a roughened sidewall for a die structure and forming a capping member to cover the roughened sidewall. As a result, adhesion between the die structure and the capping member is increased or improved. Delamination of the capping member from the die structure is minimized or avoided. The overall strength of the semiconductor structure is also increased or improved.

FIG. 1 is a schematic cross-sectional view of a first semiconductor structure 100 in accordance with some embodiments of the present disclosure. In some embodiments, the first semiconductor structure 100 includes a die structure 101 and a capping member 102 surrounding the die structure 101. The first semiconductor structure 100 is a chip, a package or a part of the chip or the package. In some embodiments, the die structure 101 is a die, a chip or a package. In some embodiments, the die structure 101 is a logic die, a central processing unit (CPU) die, a micro control unit (MCU) die, an input-output (IO) die, an application processor (AP) die, or the like. The die structure 101 includes a substrate 101*a*, a die pad 101*d*, a passivation 101*e*, a dielectric 101*f*, and an interconnect structure 101*g*. The die structure 101 is surrounded by the capping member 102.

The substrate 101*a* includes semiconductive material such as silicon, germanium, gallium, arsenic, or a combination thereof. In some embodiments, the substrate 101*a* is a semiconductor wafer. In some embodiments, the substrate 101*a* is a silicon substrate. The substrate 101*a* includes a first surface 101*b* and a second surface 101*c* opposite to the first surface 101*b*. In some embodiments, the first surface 101*b* is a front side or an active side that several electrical components are disposed thereon. In some embodiments, the second surface 101*c* is a back side or an inactive side that electrical component disposed thereon is absent.

The substrate 101*a* has a sidewall 101*p* extending between the first surface 101*b* and the second surface 101*c*. In some embodiments, the sidewall 101*p* has a roughness that the sidewall 101*p* is not a planar surface. In some embodiments, the roughness is formed by etching or any other suitable operation. In some embodiments, the sidewall 101*p* is a roughened sidewall.

Figure 5:
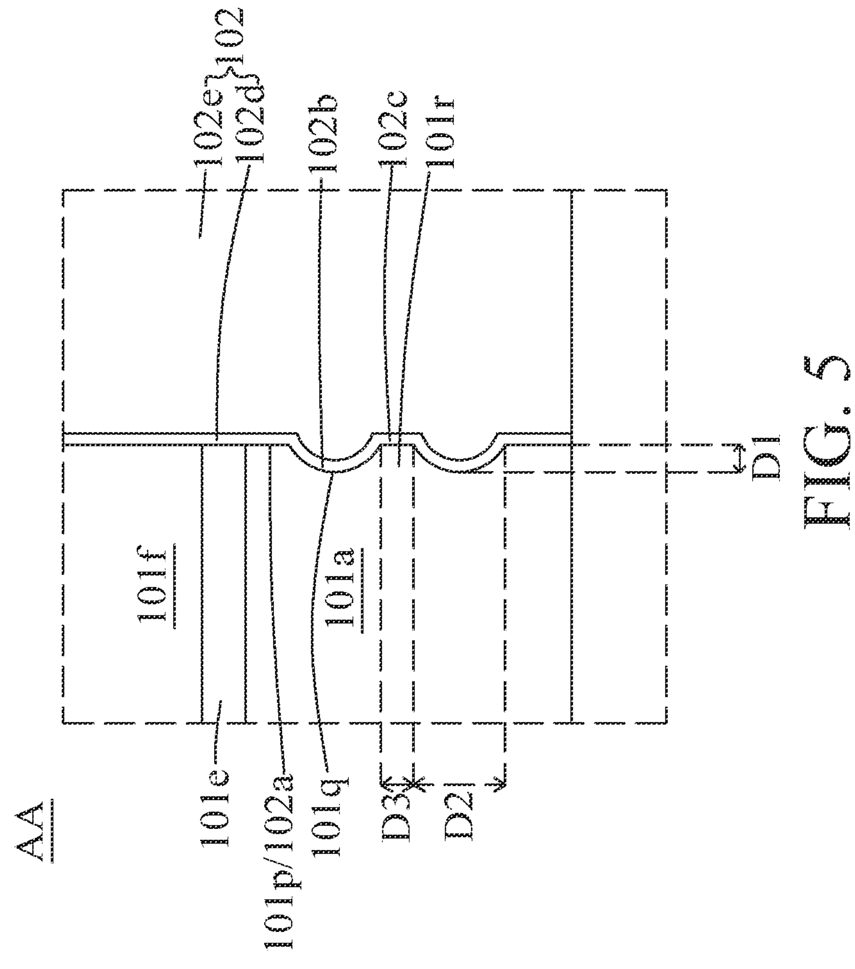
FIG. 5 is an enlarged view of an embodiment of a portion AA in any one FIGS. 1 to 4.

FIG. 5 is an enlarged view of a portion AA of FIG. 1 illustrating the sidewall 101*p* of the substrate 101*a*. Referring to FIG. 5, the sidewall 101*p* includes several recesses 101*q* extending into the substrate 101*a*. A number of the recesses 101*q* present along the sidewall 101*p* is more than one. In some embodiments, the number of the recesses 101*q* is three. Each of the recesses 101*q* has a depth D1 of greater than or equal to 0.5 um. In some embodiments, the depth D1 is about 1 um. Each of the recesses 101*q* has a width D2 of greater than 0.1 um. In some embodiments, the width D2 is about 2 um. The recesses 101*q* are spaced from each other in a distance D3 of greater than 0.1 um. In some embodiments, the distance D3 is about 1 um. In some embodiments, the sidewall 10*p* of the substrate 101*a* has several protrusions 101*r* protruded from the substrate 101*a*. The protrusions 101*r* are alternately disposed with the recesses 101*q*.

Referring back to FIG. 1, the die pad 101*d* is disposed on the substrate 101*a*. In some embodiments, the die pad 101*d* is disposed on the first surface 101*b* of the substrate 101*a*. The die pad 101*d* is configured to receive an external interconnect structure, so that the substrate 101*a* or the electrical components on or within the substrate 101*a* can electrically connect to the external interconnect structure via the die pad 101*d*. The die pad 101*d* includes conductive material such as aluminum or the like.

The passivation 101*e* is disposed on the substrate 101*a* and surrounds the die pad 101*d*. In some embodiments, the passivation 101*e* is disposed on the first surface 101*b* of the substrate 101*a*. The die pad 101*d* is at least partially exposed through the passivation 101*e*. The passivation 101*e* includes dielectric material such as silicon oxide, silicon nitride, silicon carbide, silicon oxynitride or the like.

The dielectric 101*f* is disposed on the passivation 101*e*. In some embodiments, the dielectric 101*f* is disposed over the first surface 101*b* of the substrate 101*a*. The dielectric 101*f* includes dielectric material such as polymer, polyimide, polybenzoxazole (PBO) or the like. The interconnect structure 101*g* is disposed within the dielectric 101*f*. The interconnect structure 101*g* is electrical routing within the die structure 101. The interconnect structure 101*g* is electrically coupled with the die pad 101*d*. The interconnect structure 101*g* extends from the die pad 101*d* and away from the substrate 101. The interconnect structure 101*g* includes conductive material such as copper, silver or the like. In some embodiments, a sidewall of the dielectric 101*f* is disposed above and substantially coplanar with the sidewall 101*p* of the substrate 101*a*. In some embodiments, an inter-metal dielectric (IMD) 101*j* comprising the dielectric 101*f* and the interconnect structure 101*g* is disposed over the substrate 101*a*.

In some embodiments, the interconnect structure 101*g* includes a via portion 101*h* and a pad portion 101*i* coupled with the via portion 101*h*. The via portion 101*h* extends vertically within the dielectric 101*f*. The pad portion 101*i* extends laterally within the dielectric 101*f*. The pad portion 101*i* is coupled with the die pad 101*d*. In some embodiments, the interconnect structure 101*g* includes a seal ring member 101*k* disposed adjacent to a periphery of the die structure 101. The seal ring member 101*k* surrounds the interconnect structure 101*g*. The seal ring member 101*k* extends vertically within the dielectric 101*f*. The seal ring member 101*k* is a dummy structure and is electrically isolated from the pad portion 101*i*, the via portion 101*h*, the die pad 101*d*, and an electrical component in the substrate 101*a*. In some embodiments, the seal ring member 101*k* is connected to an electrical ground.

The capping member 102 surrounds the die structure 101. The capping member 102 extends along and contacts a sidewall of the die structure 101. The capping member 102 is in contact with the substrate 101*a*, the passivation 101*e*, and the dielectric 101*f*. The capping member 102 includes organic polymeric material such as epoxy, molding compound, polyimide, resin or the like. In some embodiments, a portion of the capping member 102 is disposed within the recesses 101*q* of the sidewall 101*p* of the substrate 101*a*. Each of the recesses 101*q* of the substrate 101*a* surrounds at least a portion of the capping member 102.

The capping member 102 has a sidewall 102*a* contacting the sidewall 101*p* of the substrate 101*a* and the sidewall of the dielectric 101*f*. In some embodiments, the sidewall 102*a* of the capping member 102 is complementary with the sidewall 101*p* of the substrate 101*a*. Referring to FIG. 5, the sidewall 102*a* of the capping member 102 includes several protrusions 102*b* disposed within the recesses 101*q* of the substrate 101*a* correspondingly. The protrusions 102*b* are complementary with the recesses 101*q*. In some embodiments, the protrusions 102*b* of the capping member 102 are spaced apart from each other in the distance D3 of substantially greater than 0.1 um.

The capping member 102 includes several recesses 102*c* surrounding the protrusions 101*r* of the substrate 101*a* correspondingly. The recesses 102*c* of the capping member 102 are complementary with the protrusions 101*r* of the substrate 101*a*. Since the sidewall 101*p* of the substrate 101*a* has the recesses 101*q* complementary with the protrusions 102*b* of the capping member 102, contact surface between the substrate 101*a* and the capping member 102 is increased or improved. Therefore, an adhesion between the substrate 101*a* and the capping member 102 is increased or improved. Delamination of the capping member 102 from the die structure 101 is minimized or avoided.

In some embodiments, the capping member 102 is a multilayers structure. In some embodiments, the capping member 102 includes a first layer 102*d* contacting the die structure 101, and a second layer 102*e* conformal to the first layer 102*d*. The first layer 102*d* is conformal to the entire sidewall 101*p* of the substrate 101*a*. In some embodiments, the first layer 102*d* is conformal to the recesses 101*q* and the protrusions 101*r* of the substrate 101*a*. The second layer 102*e* is at least partially disposed within the recesses 101*q* of the substrate 101*a*. In some embodiments, a fluidity of the first layer 102*d* is substantially greater than a fluidity of the second layer 102*e*. In some embodiments, a molecular chain length of the first layer 102*d* is substantially less than a molecular chain length of the second layer 102*e*. In some embodiments, a ratio of carbon to fluorine of the first layer 102*d* is different from a ratio of carbon to fluorine of the second layer 102*e*.

Figure 6:
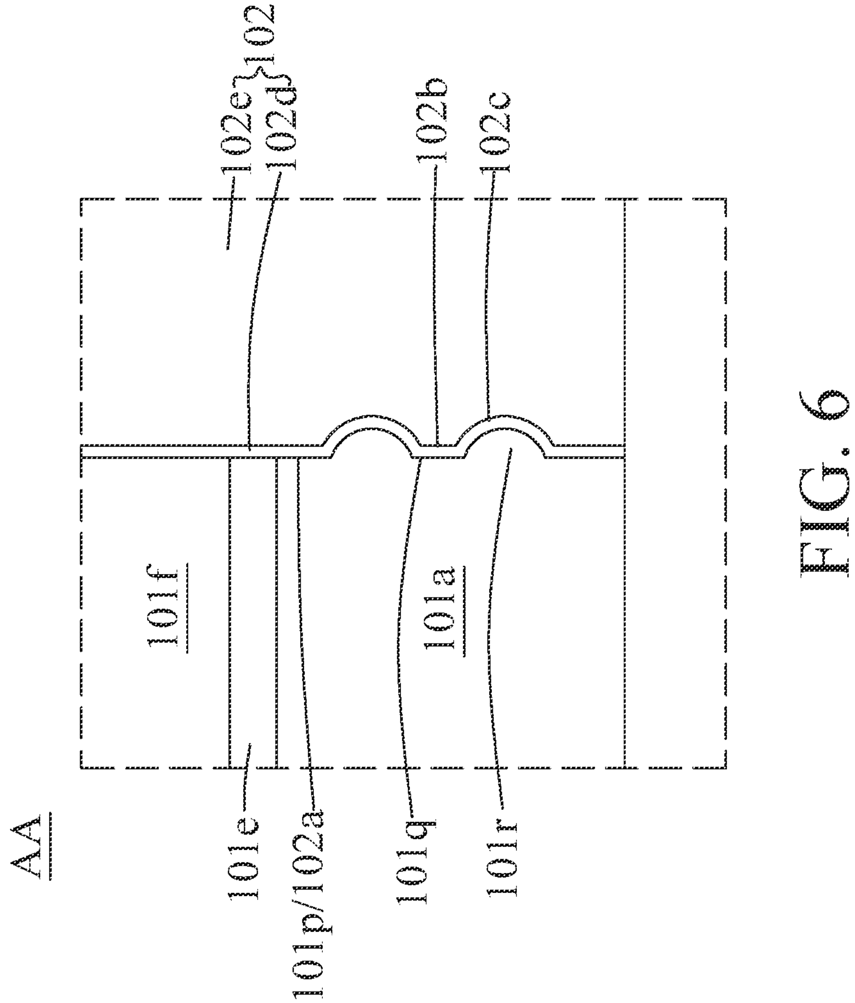
FIG. 6 is an enlarged view of an embodiment of a portion AA in any one FIGS. 1 to 4.

Alternatively, the sidewall 101*p* of the substrate 101*a* and the sidewall 102*a* of the capping member 102 are in configurations different from the embodiment shown in FIGS. 1 and 5. In some embodiments, the sidewall 101*p* of the substrate 101*a* and the sidewall 102*a* of the capping member 102 are in configurations as shown in FIG. 6. Referring to FIG. 6, the substrate 101 has several protrusions 101*r* protruded into corresponding recesses 102*c*.

Figure 7:
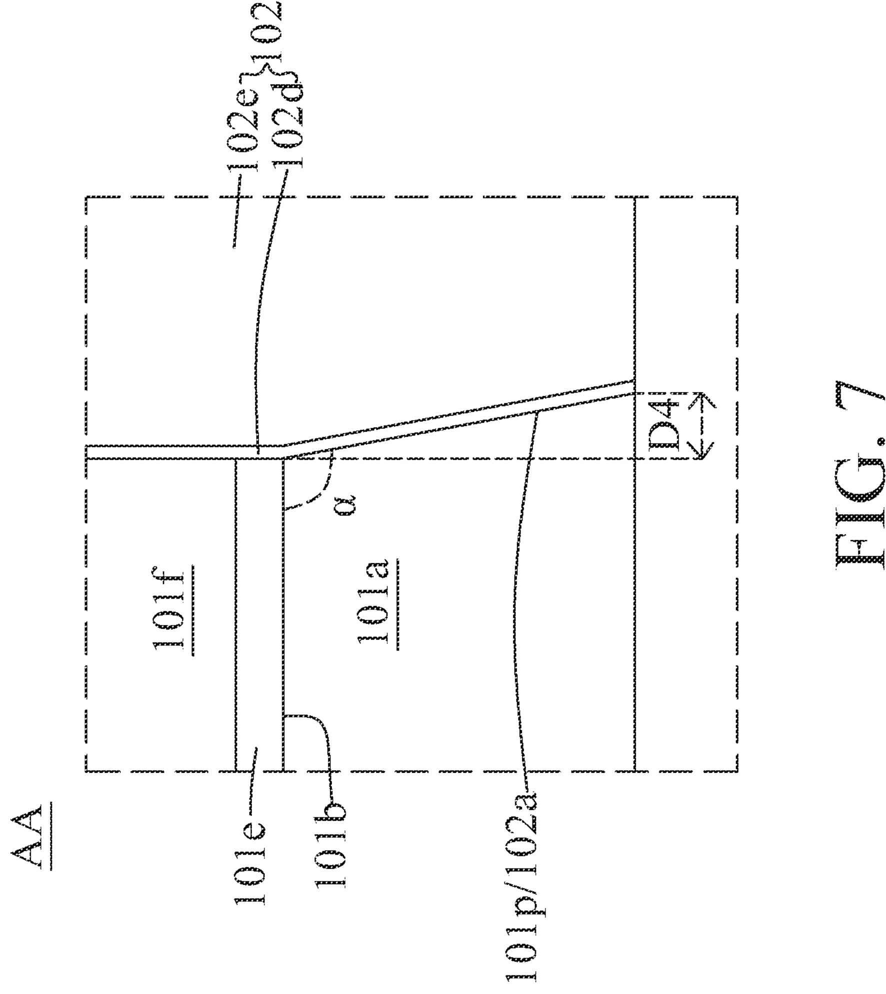
FIG. 7 is an enlarged view of an embodiment of a portion AA in any one FIGS. 1 to 4.

In some embodiments, the sidewall 101*p* of the substrate 101*a* and the sidewall 102*a* of the capping member 102 are in configurations as shown in FIG. 7. The sidewall 101*p* of the substrate 101*a* and the sidewall 102*a* of the capping member 102 are slanted sidewalls. In some embodiments, an interior angle α between the sidewall 101*p* and the first surface 101*b* of the substrate 101*a* is an obtuse angle. In some embodiments, a horizontal distance D4 between the sidewall 101*p* of the substrate 101*a* and a vertical line is substantially greater than 0.5 um.

Figure 8:
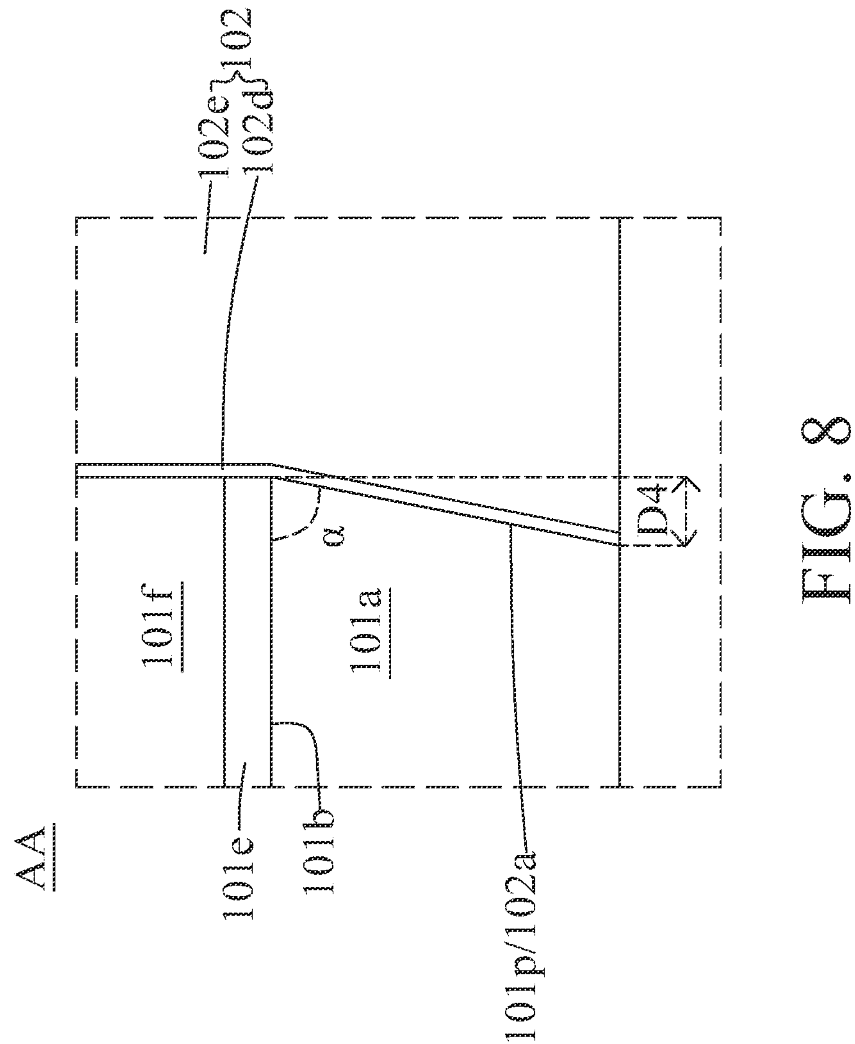
FIG. 8 is an enlarged view of an embodiment of a portion AA in any one FIGS. 1 to 4.

In some embodiments, the sidewall 101*p* of the substrate 101*a* and the sidewall 102*a* of the capping member 102 are in configurations as shown in FIG. 8. The sidewall 101*p* of the substrate 101*a* and the sidewall 102*a* of the capping member 102 are slanted sidewalls. In some embodiments, an interior angle α between the sidewall 101*p* and the first surface 101*b* of the substrate 101*a* is an acute angle. In some embodiments, a horizontal distance D4 between the sidewall 101*p* of the substrate 101*a* and a vertical line is substantially greater than 0.5 um.

Figure 9:
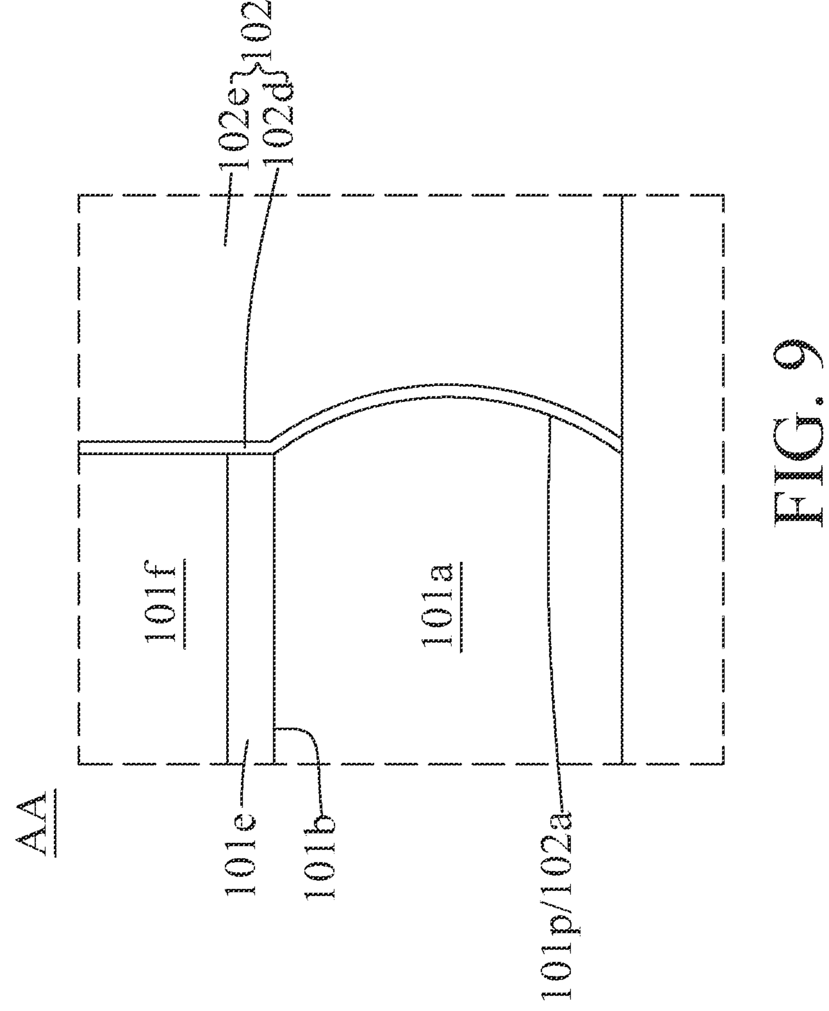
FIG. 9 is an enlarged view of an embodiment of a portion AA in any one FIGS. 1 to 4.

In some embodiments, the sidewall 101*p* of the substrate 101*a* and the sidewall 102*a* of the capping member 102 are in configurations as shown in FIG. 9. The sidewall 101*p* of the substrate 101*a* is a convex sidewall, while the sidewall 102*a* of the capping member 102 is a concave sidewall complementary with the sidewall 101*p* of the substrate 101*a*.

Figure 10:
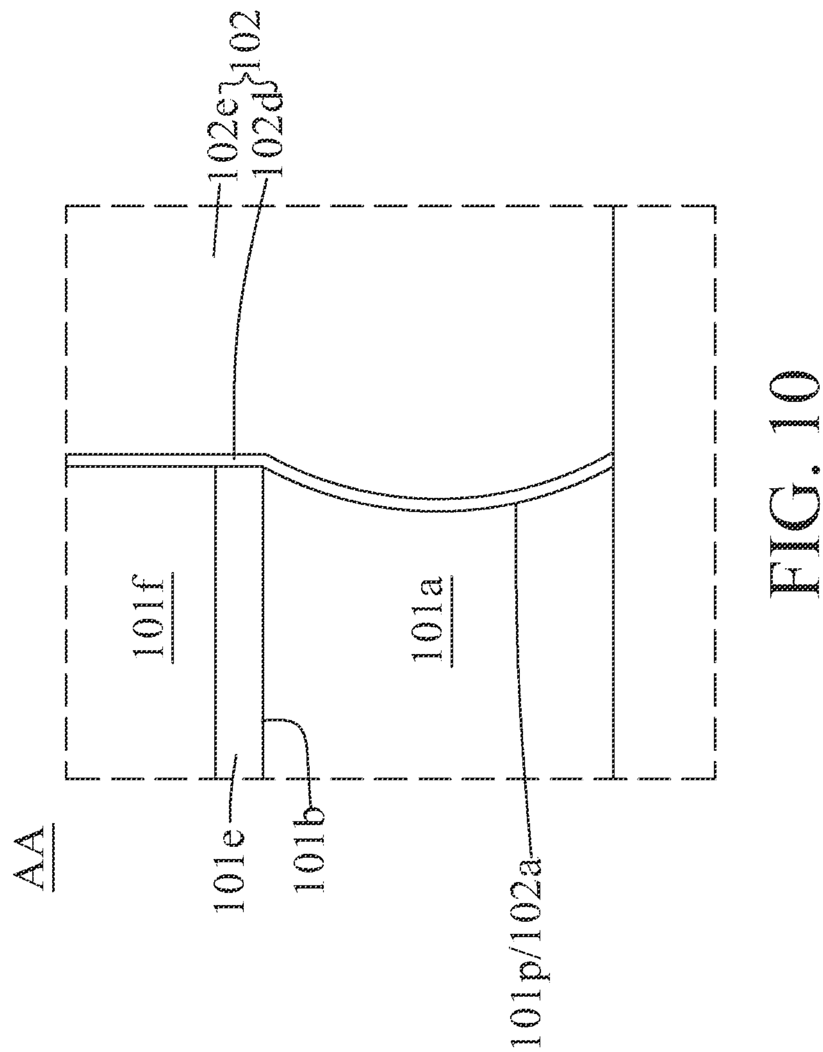
FIG. 10 is an enlarged view of an embodiment of a portion AA in any one FIGS. 1 to 4.

In some embodiments, the sidewall 101*p* of the substrate 101*a* and the sidewall 102*a* of the capping member 102 are in configurations as shown in FIG. 10. The sidewall 101*p* of the substrate 101*a* is a concave sidewall, while the sidewall 102*a* of the capping member 102 is a convex sidewall complementary with the sidewall 101*p* of the substrate 101*a*.

Referring back to FIG. 1, in some embodiments, a bonding dielectric 101*m* is disposed on disposed over the dielectric 101*f* of the die structure 101 and surrounded by the capping member 102. The capping member 102 is in contact with the bonding dielectric 101*m*, the dielectric 101*f* and the substrate 101*a*. The bonding dielectric 101*m* includes dielectric material such as oxide or the like. In some embodiments, the bonding dielectric 101*m* includes silicon oxide.

In some embodiments, a bonding pad 101*n* is disposed over the interconnect structure 101*g* and surrounded by the bonding dielectric 101*m*. The bonding pad 101*n* is at least partially exposed through the bonding dielectric 101*m* and is configured to receive an external interconnect structure. The bonding pad 101*n* is electrically connected with the interconnect structure 101*g*. The bonding pad 101*n* is electrically coupled with the pad portion 101*i*. The bonding pad 101*n* includes conductive material such as copper, silver or the like.

Figure 2:
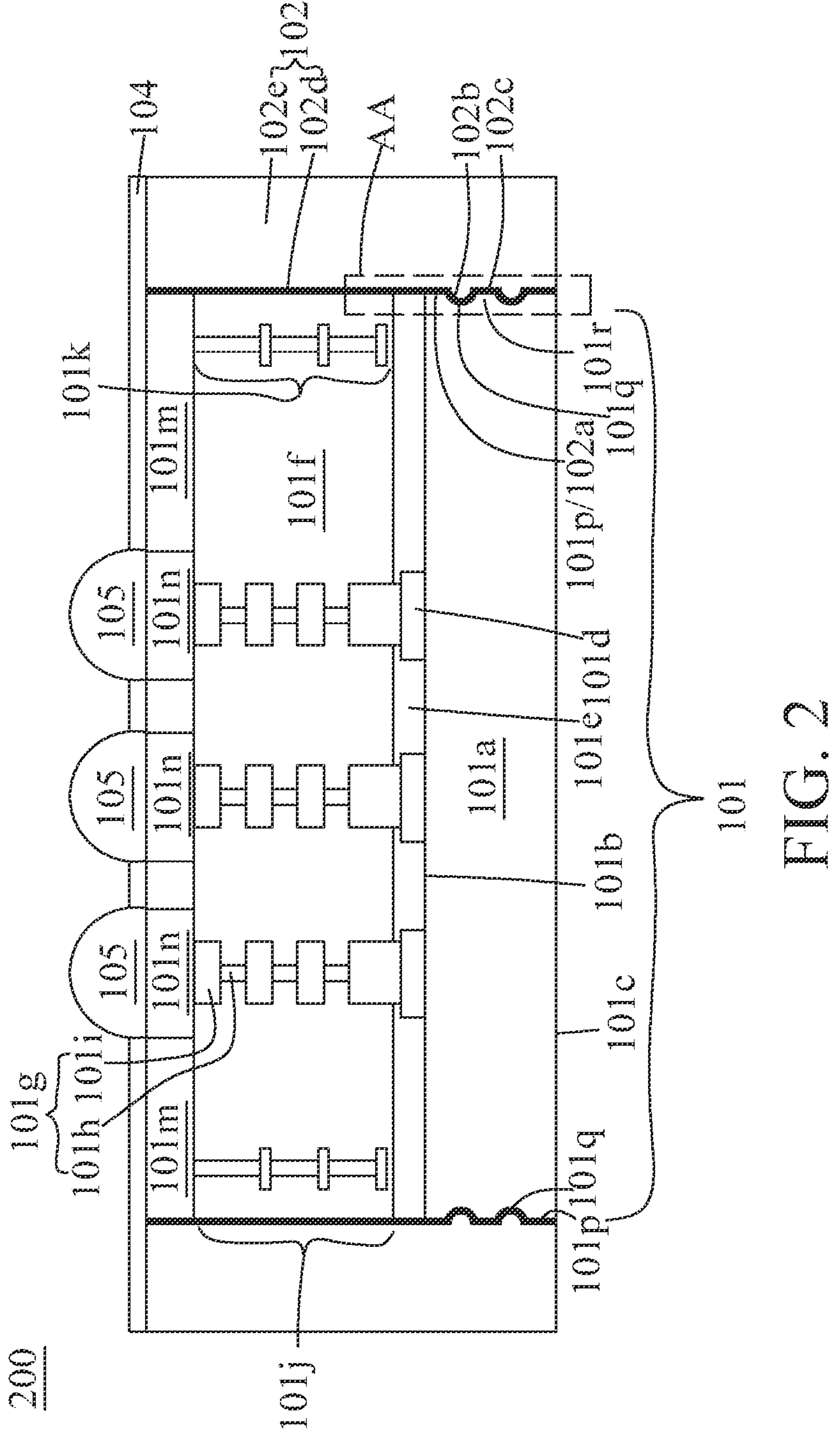
FIG. 2 is a cross-sectional view of a semiconductor structure in accordance with another embodiment of the present disclosure.

FIG. 2 is a schematic cross-sectional view of a second semiconductor structure 200 in accordance with some embodiments of the present disclosure. The second semiconductor structure 200 is similar to the first semiconductor structure 100 of FIG. 1, except a second passivation 104 is disposed over the capping member 102 and the bonding dielectric 101*m*, and a conductive bump 105 is disposed on the bonding pad 101*n*.

The second passivation 104 surrounds the conductive bump 105. The second passivation 104 includes dielectric material such as silicon oxide, silicon nitride, silicon carbide, silicon oxynitride or the like. The conductive bump 105 is protruded from the die structure 101. The conductive bump 105 is configured to mount on another die structure and electrically connect with an external interconnect structure or another die structure. In some embodiments, the conductive bump 105 is ball grid array (BGA) balls, controlled collapse chip connection (C4) bumps, microbumps, pillars or the like. The conductive bump 105 includes metals such as lead, tin copper, gold, nickel, etc. or metal alloy such as combination of lead, tin copper, gold, nickel, etc.

Figure 3:
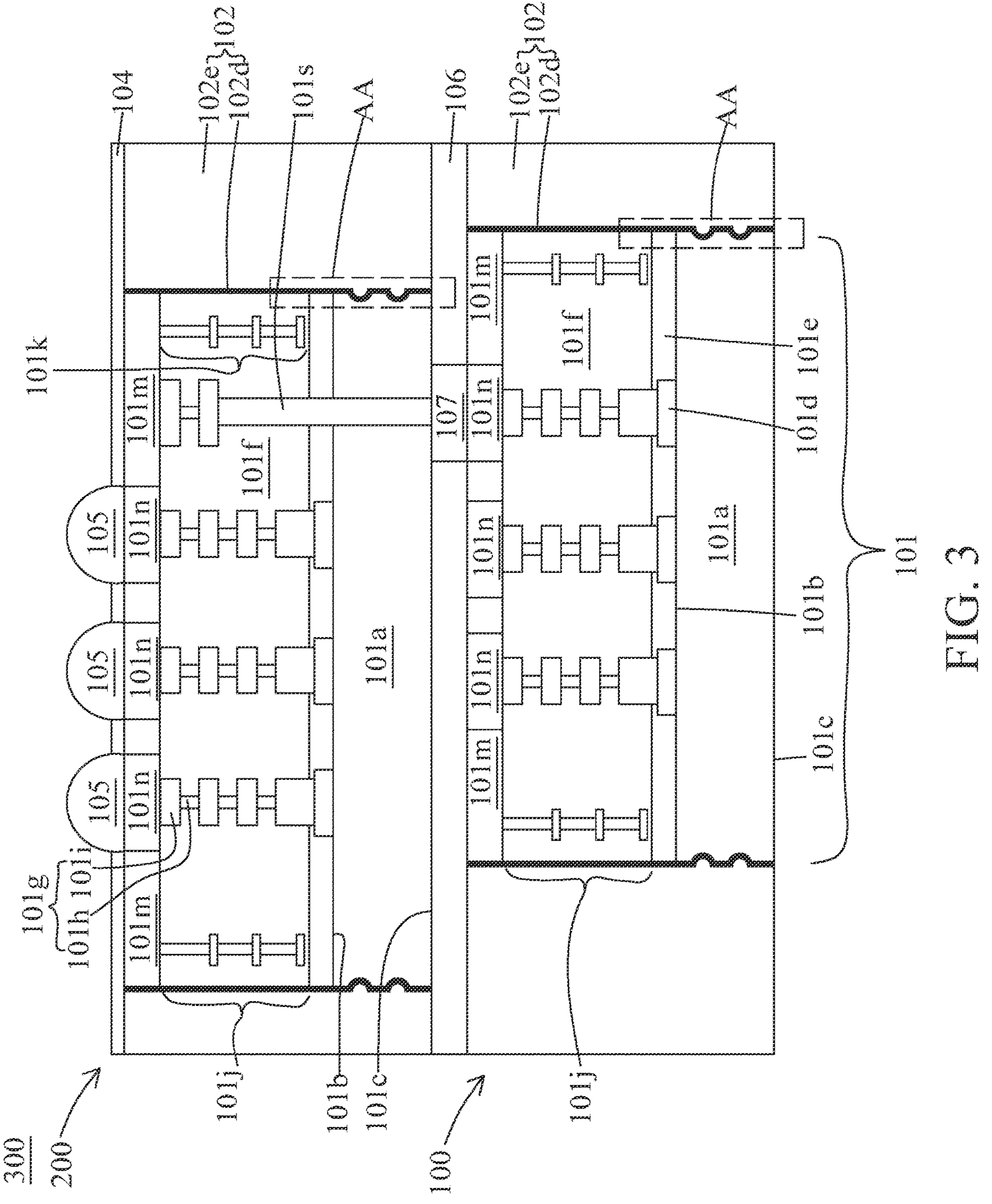
FIG. 3 is a cross-sectional view of a semiconductor structure in accordance with another embodiment of the present disclosure.

FIG. 3 is a schematic cross-sectional view of a third semiconductor structure 300 in accordance with some embodiments of the present disclosure. The third semiconductor structure 300 includes the first semiconductor structure 100 and the second semiconductor structure 200 stacked over the first semiconductor structure 100. The first semiconductor structure 100 is similar to the one illustrated in FIG. 1 and discussed above. The second semiconductor structure 200 is similar to the one illustrated in FIG. 2 and discussed above.

In some embodiments, the second semiconductor structure 200 further includes a via 101*s* extending partially through the dielectric 101*f* and extending through the substrate 101*a*. The via 101*s* is electrically coupled with the pad portion 101*i* or the via portion 101*h* of the interconnect structure 101*g*. The via 101*s* is at least partially exposed through the second surface 101*c* of the substrate 101*a*.

The third semiconductor structure 300 includes a second bonding dielectric 106 between the first semiconductor structure 100 and the second semiconductor structure 200, and a second bonding pad 107 surrounded by the second bonding dielectric 106. The second bonding dielectric 106 bonds with the bonding dielectric 101*m* of the first semiconductor structure 100, and the second bonding pad 107 bonds with the bonding pad 101*n* of the first semiconductor structure 100. The via 101*s* is electrically coupled with the second bonding pad 107. In some embodiments, the die structure 101 of the first semiconductor structure 100 is electrically coupled with the die structure 101 of the second semiconductor structure 200 through the bonding pad 101*n* of the first semiconductor structure 100, the via 101*s* and the second bonding pad 107. In some embodiments, the die structure 101 of the second semiconductor structure 200 is horizontally shifted from the die structure 101 of the first semiconductor structure 100.

Figure 4:
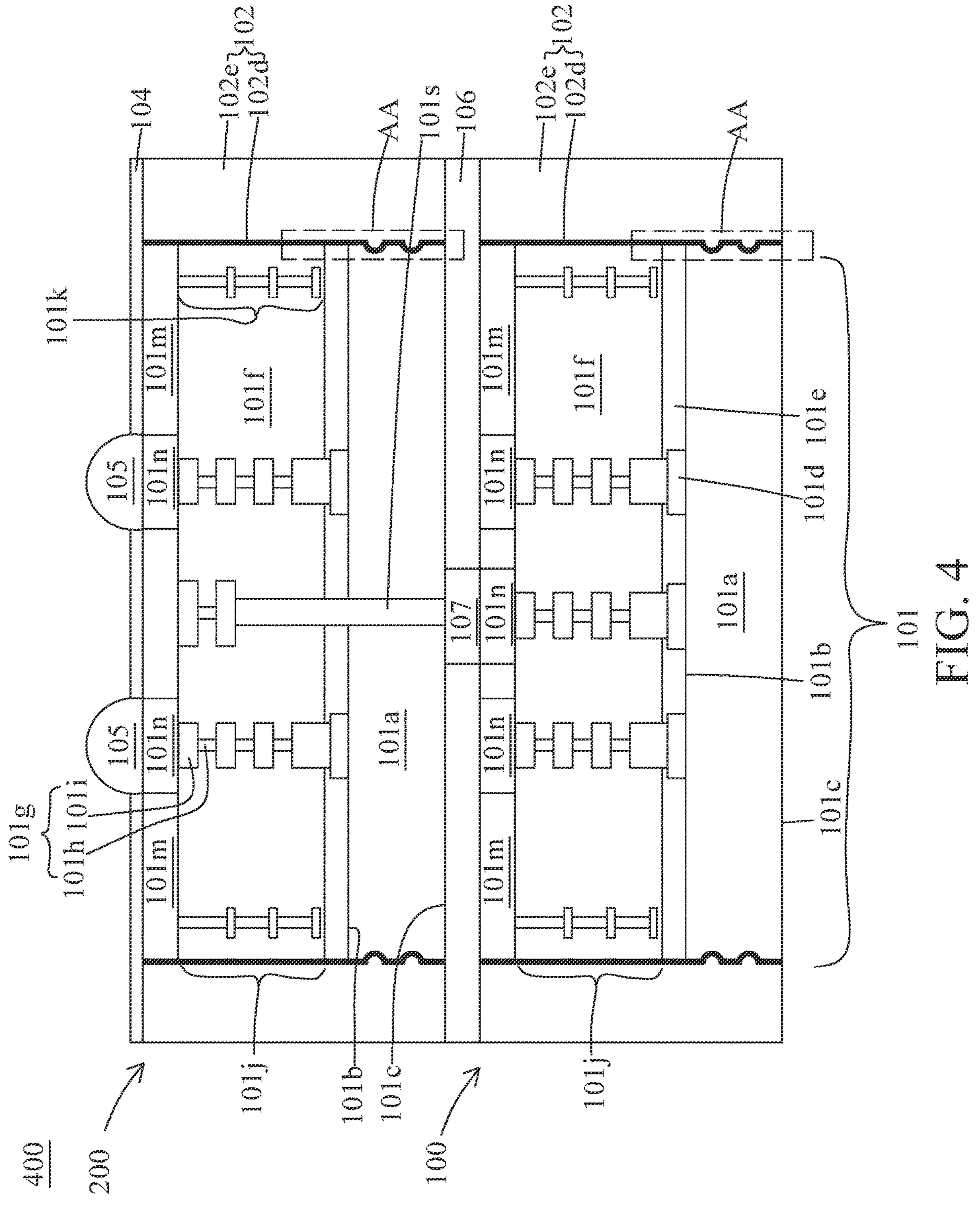
FIG. 4 is a cross-sectional view of a semiconductor structure in accordance with another embodiment of the present disclosure.

FIG. 4 is a schematic cross-sectional view of a fourth semiconductor structure 400 in accordance with some embodiments of the present disclosure. The fourth semiconductor structure 400 includes the first semiconductor structure 100 and the second semiconductor structure 200 stacked over the first semiconductor structure 100. The first semiconductor structure 100 is similar to the one illustrated in FIG. 1 or 3 and discussed above. The second semiconductor structure 200 is similar to the one illustrated in FIG. 2 or 3 and discussed above. The fourth semiconductor structure 400 is similar to the third semiconductor structure 300, except the die structure 101 of the first semiconductor 100 is aligned with the die structure 101 of the second semiconductor structure 200. In some embodiments, the capping member 102 of the first semiconductor structure 100 is also aligned with the capping member 102 of the second semiconductor structure 200.

Figure 11:
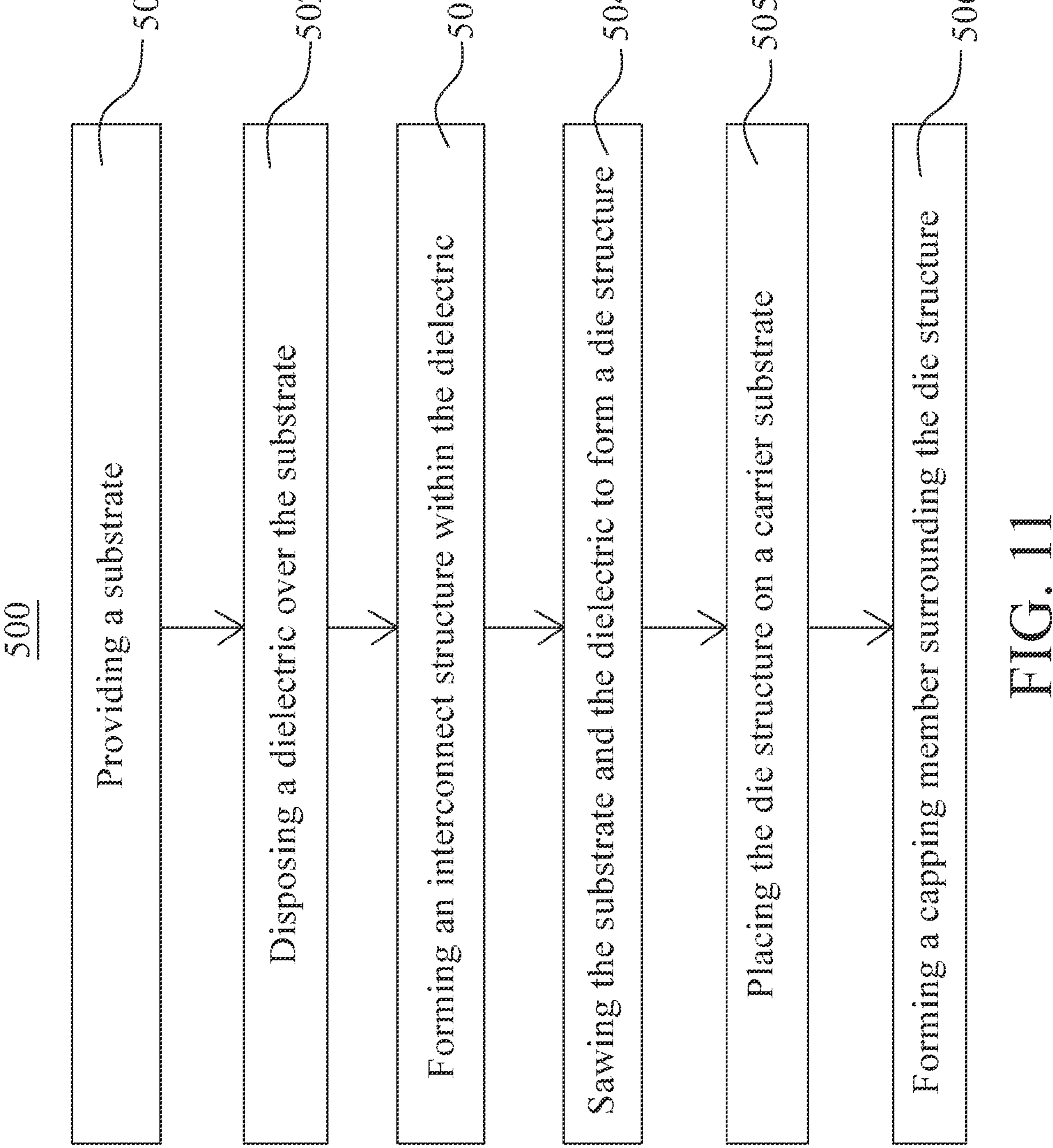
FIG. 11 is a flow diagram of a method of manufacturing a semiconductor structure in accordance with some embodiments of the present disclosure.

In the present disclosure, a method of manufacturing a semiconductor structure (100, 200, 300 or 400) is also disclosed. In some embodiments, the semiconductor structure (100, 200, 300 or 400) is formed by a method 500. The method 500 includes a number of operations and the description and illustration are not deemed as a limitation as the sequence of the operations. FIG. 11 is an embodiment of the method 500 of manufacturing the semiconductor structure (100, 200, 300 or 400). The method 500 includes a number of operations (501, 502, 503, 504, 505 and 506).

Figure 12:
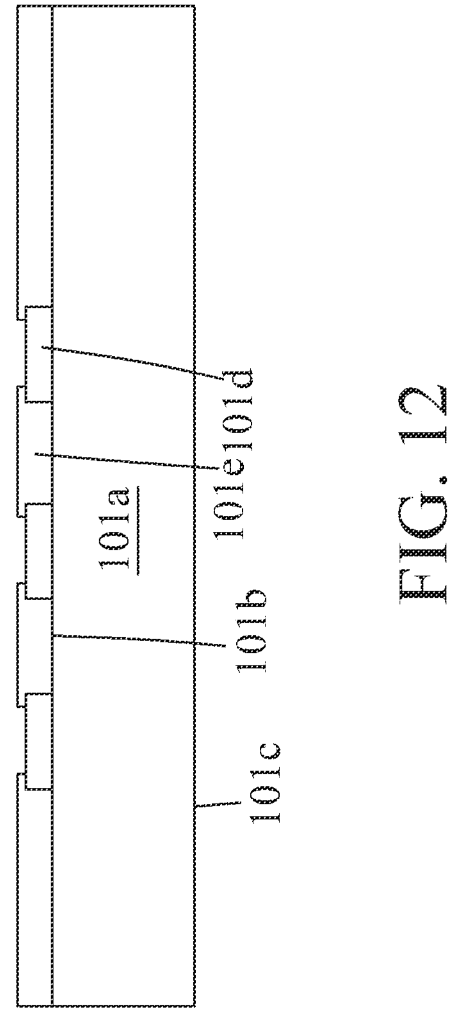
FIGS. 12 to 25 are cross-sectional views of one or more stages of the method of manufacturing a semiconductor structure in accordance with some embodiments of the present disclosure.

In operation 501, a substrate 101*a* is provided as shown in FIG. 12. The substrate 101*a* is a semiconductor wafer. In some embodiments, the substrate 101*a* is a silicon substrate. The substrate 101*a* includes a first surface 101*b* and a second surface 101*c* opposite to the first surface 101*b*. In some embodiments, the substrate 101*a* has similar configurations as the one illustrated in any one of FIGS. 1 to 4 and discussed above.

A die pad 101*d* is disposed on the substrate 101*a*, configured to receive an external interconnect structure, and includes conductive material such as aluminum or the like. A passivation 101*e* is disposed on the substrate 101*a* and surrounds the die pad 101*d*. The die pad 101*d* is at least partially exposed through the passivation 101*e*. The passivation 101*e* includes dielectric material such as silicon oxide, silicon nitride, silicon carbide, silicon oxynitride or the like. In some embodiments, the die pad 101*d* and the passivation 101*e* have similar configurations as those illustrated in any one of FIGS. 1 to 4 and discussed above.

Figure 13:
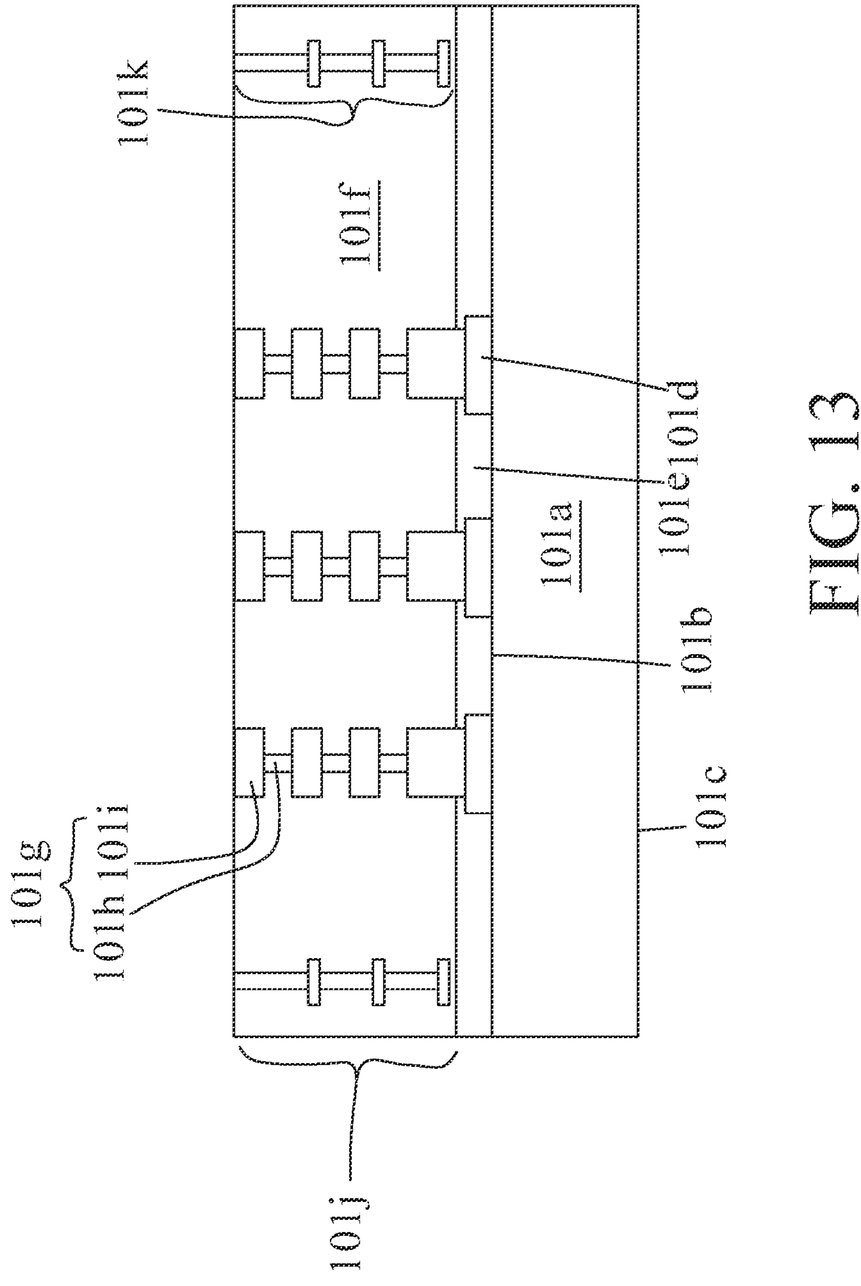

In operation 502, a dielectric 101*f* is disposed over the substrate 101*a* as shown in FIG. 13. The dielectric 101*f* covers the passivation 101*e*. The dielectric 101*f* is disposed by deposition, chemical vapor deposition (CVD) or any other suitable operations. In some embodiments, the dielectric 101*f* has similar configurations as the one illustrated in any one of FIGS. 1 to 4 and discussed above.

In operation 503, an interconnect structure 101*g* is formed within the dielectric 101*f* as shown in FIG. 13. The interconnect structure 101*g* is formed by removing some portions of the dielectric 101*f*, and then disposing conductive material surrounded by the dielectric 101*f*. The portions of the dielectric 101*f* are removed by photolithography, etching or any other suitable operations. The conductive material is disposed by electroplating, sputtering or any other suitable operations. In some embodiments, the interconnect structure 101*g* is electrically coupled with the die pad 101*d*. In some embodiments, a pad portion 101*i* of the interconnect structure 101*g* is at least partially exposed through the dielectric 101*f*. In some embodiments, the interconnect structure 101*g* has similar configurations as the one illustrated in any one of FIGS. 1 to 4 and discussed above.

Figure 14:
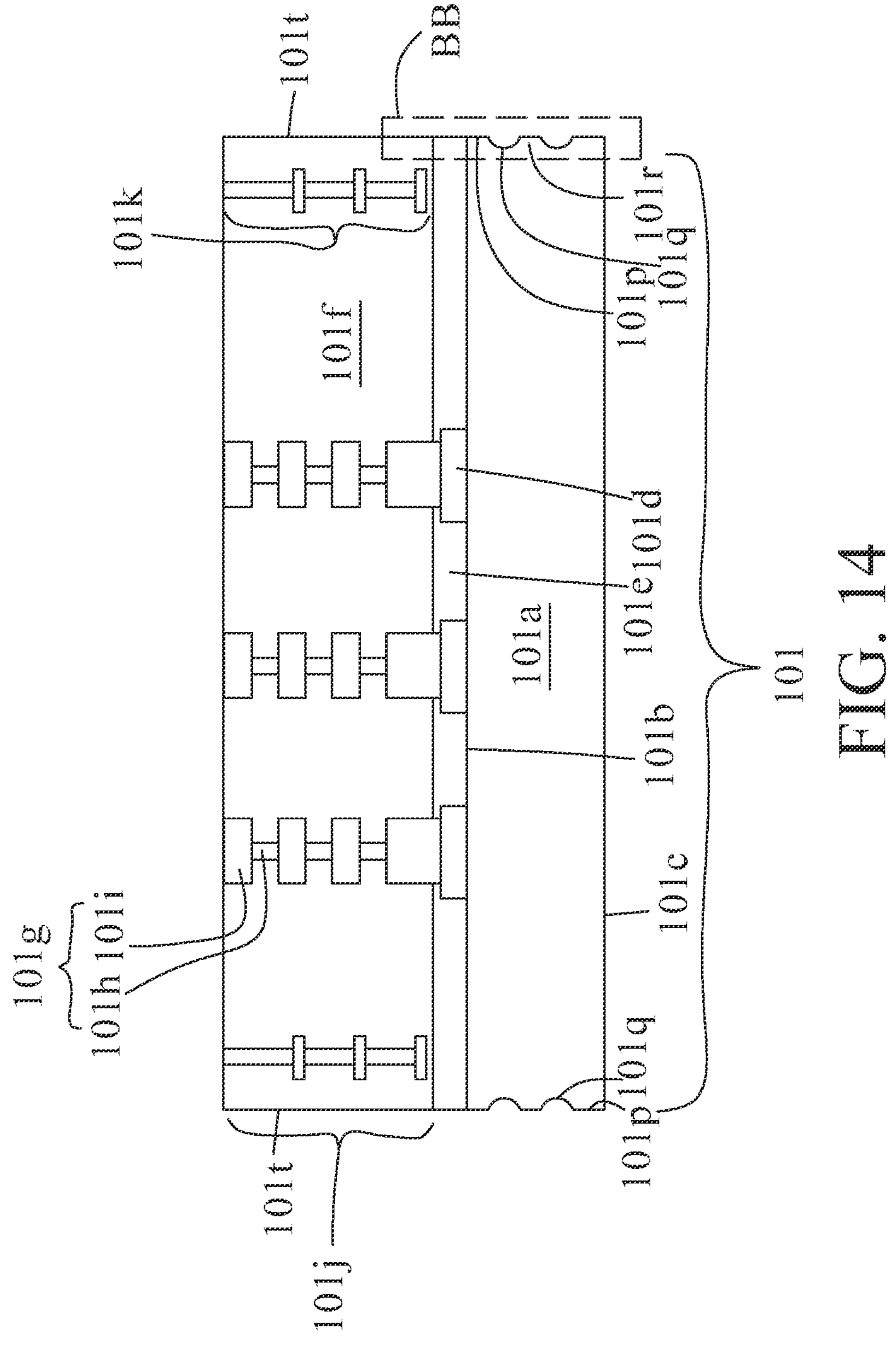

In operation 504, the substrate 101*a* and the dielectric 101*f* are sawn to form a die structure 101 as shown in FIG. 14. The substrate 101*a* and the dielectric 101*f* are sawn along a sidewall 101*t* of the dielectric 101*f* and a sidewall 101*p* of the substrate 101*a* to form the die structure 101. In some embodiments, the substrate 101*a* and the dielectric 101*f* are sawn by etching, singulation, die sawing or any other suitable operations. The sawing of the substrate 101*a* and the dielectric 101*f* includes removing a portion of the dielectric 101*f* along the sidewall 101*t* by etching, and then removing a first portion of the substrate 101*a* along the sidewall 101*p* by etching. In some embodiments, the sawing of the dielectric 101*f* is prior to the sawing of the substrate 101*a*. A sidewall 101*p* of the substrate 101*a* and a sidewall 101*t* of the dielectric 101*f* are formed after the sawing of the substrate 101*a* and the dielectric 101*f*. The sidewall 101*p* of the substrate 101*a* extends between the first surface 101*b* and the second surface 101*c* of the substrate 101*a*.

Figure 15:
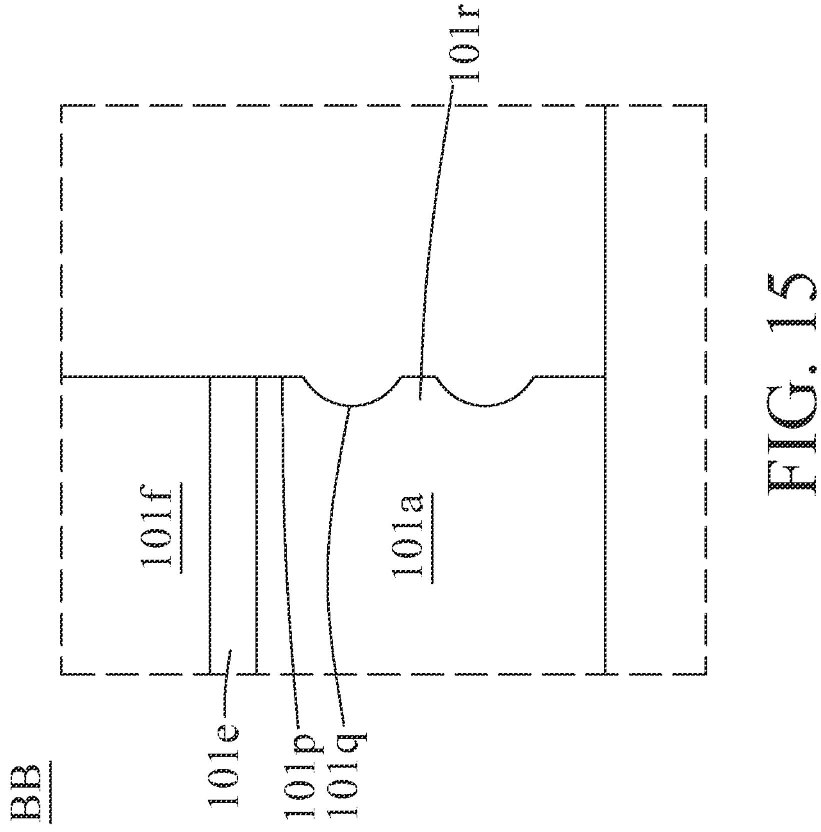

In some embodiments, the sawing of the substrate 101*a* includes forming the sidewall 101*p* of the substrate 101*a* having several recesses 101*q* extending into the substrate 101*a* as shown in FIG. 14. After the removal of the portion of the dielectric 101*f* and the first portion of the substrate 101*a*, a second portion of the substrate 101*a* is further removed to form several recesses 101*q* indented into the substrate 101*a* as shown in FIG. 14. FIG. 15 is an enlarged view of a portion BB of FIG. 14 illustrating the recesses 101*q* formed along the sidewall 101*p* of the substrate 101*a*. In some embodiments, the sidewall 101*p* of the substrate 101*a* is a smooth or planar surface before the formation of the recesses 101*q*. The sidewall 101*p* of the substrate 101*a* becomes a roughened surface after the formation of the recesses 101*q*.

In some embodiments, the recesses 101*p* are formed by dry etching. In some embodiments, the recesses 101*p* are formed by dry reactive ion etching (DRIE), Bosch etching or any other suitable operations. After the removal of the first portion of the substrate 101*a*, a polymeric layer is disposed over the dielectric 101*f* and conformal to the sidewall 101*p*. In some embodiments, the polymeric layer includes fluorocarbon plasma such as $C_4F_8$ or the like.

After the deposition of the polymeric layer, a bottom portion of the polymeric layer is removed to expose a portion of the sidewall 101*p* of the substrate 101*a*. In some embodiments, the bottom portion of the polymeric layer is removed by anisotropic etching. The exposed portion of the sidewall 101*p* is then removed to form the recess 101*q*. In some embodiments, the exposed portion of the sidewall 101*p* is removed by isotropic etching. In some embodiments, the exposed portion of the sidewall 101*p* is removed by $SF_6$ plasma. The deposition of the polymeric layer, the removal of the bottom portion of the polymeric layer, and the removal of the exposed portion of the sidewall 101*p* of the substrate 101*a* are repeated sequentially to form the recesses 101*p* along the sidewall 101*p* as shown in FIGS. 14 and 15. The die structure 101 is formed after the formation of the recesses 101*p*.

In some embodiments, the sidewall 101*p* is processed to become a slanted sidewall as shown in FIG. 7 or 8 by etching operations, instead of the formation of the recesses 101*q*. A portion of the sidewall 101*p* of the substrate 101*a* is removed to become the slanted sidewall. In some embodiments, the sidewall 101*p* is processed to become a convex or concave sidewall as shown in FIG. 9 or 10 by etching operations, instead of the formation of the recesses 101*q*. A portion of the sidewall 101*p* of the substrate 101*a* is removed to become the convex or concave sidewall.

Figure 16:
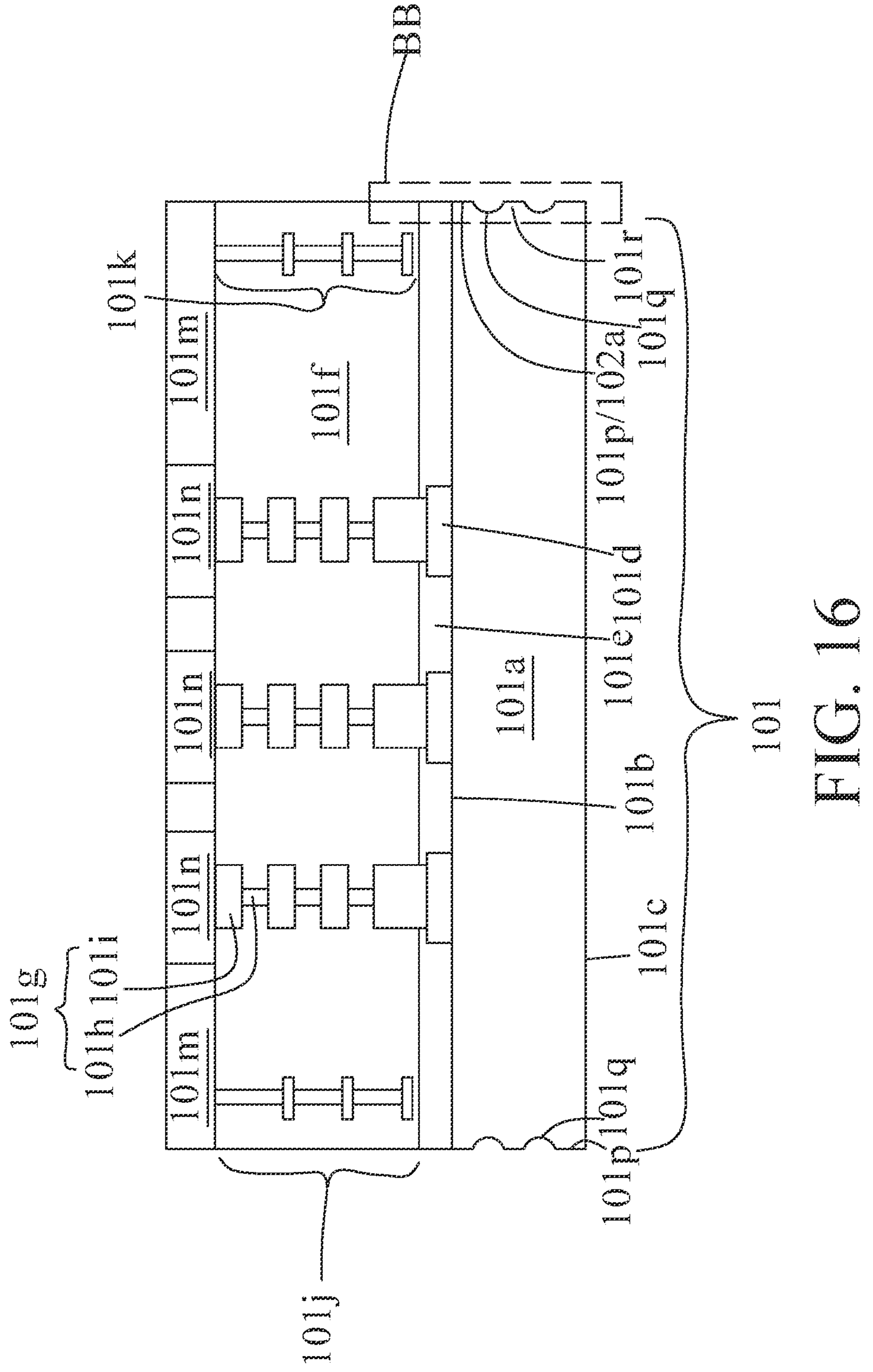

In some embodiments, a bonding dielectric 101*m* and a bonding pad 101*n* are formed over the dielectric 101*f* after the operation 504, as shown in FIG. 16. The bonding dielectric 101*m* is disposed over the dielectric 101*f* by deposition or any other suitable operations. A portion of the bonding dielectric 101*m* is removed, and then the bonding pad 101*n* is formed and surrounded by the bonding dielectric 101*m*. The bonding pad 101*n* is formed by electroplating, sputtering or any other suitable operations. The bonding pad 101*n* is electrically coupled with the interconnect structure 101*g*. In some embodiments, the bonding dielectric 101*m* and the bonding pad 101*n* have similar configurations as those illustrated in any one of FIGS. 1 to 4 and discussed above.

Figure 17:
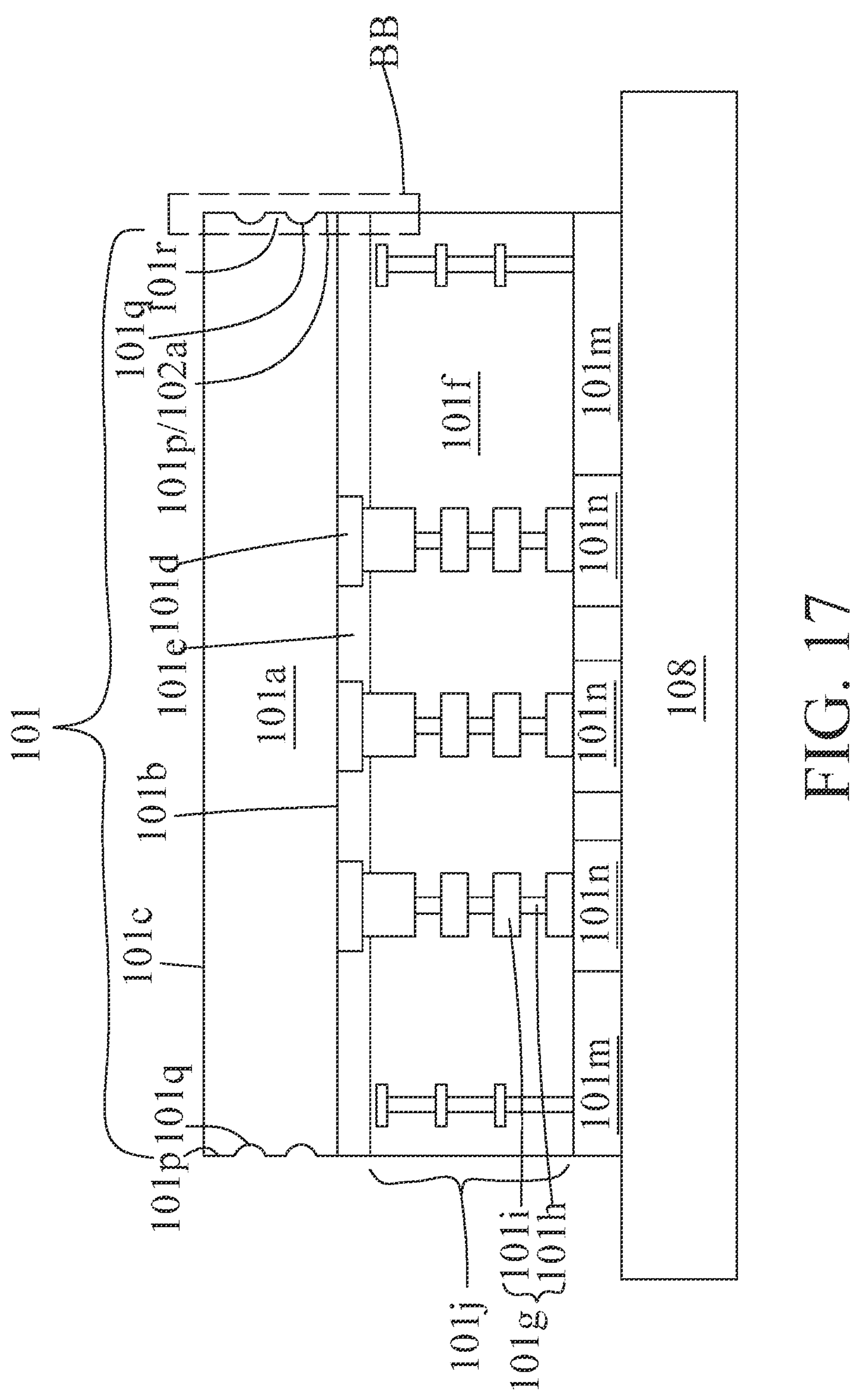

In operation 505, the die structure 101 is placed on a carrier substrate 108 as shown in FIG. 17. The carrier substrate 108 is configured to temporarily support a substrate or device thereon. The carrier substrate 108 is a blank glass, ceramic, silicon or the like. In some embodiments, the die structure 101 is flipped and then placed on the carrier substrate 108.

Figure 20:
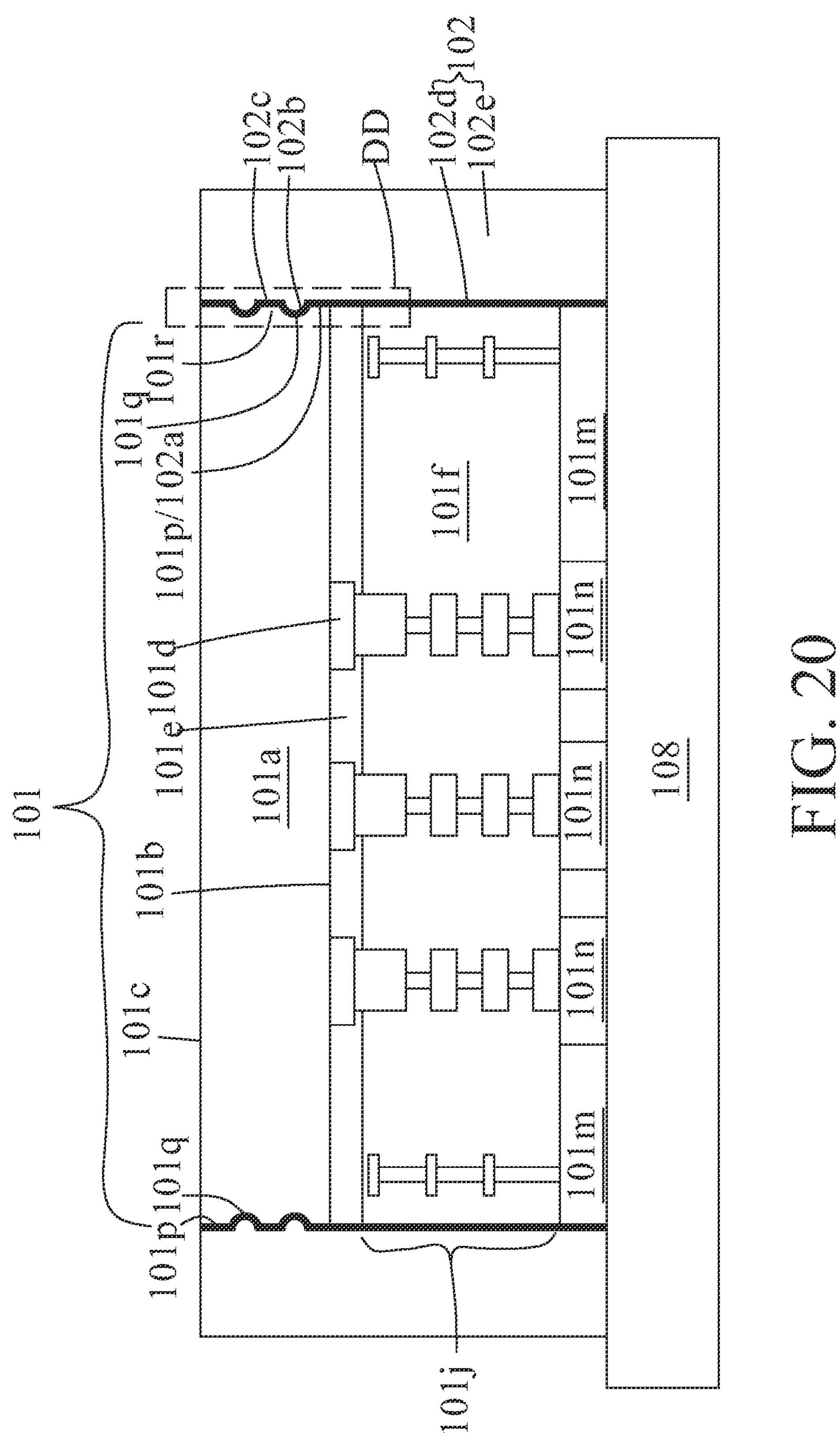

In operation 506, a capping member 102 is formed as shown in FIG. 20. The capping member 102 surrounds the die structure 101. In some embodiments, the capping member 102 is formed by disposing a polymeric material surrounding the die structure 101 and conformal to the sidewall 101*p* and the recesses 101*q* of the substrate 101*a*. In some embodiments, the capping member 102 is formed by disposing the polymeric material over the second surface 101*c* of the substrate 101*a*, over the carrier substrate 108, and contacting the sidewall 101*p* and the recesses 101*q* of the substrate 101*a*. After the disposing of the polymeric material, some portions of the polymeric material on the second surface 101*c* of the substrate 101*a* are removed by planarization or any other suitable operations. In some embodiments, the polymeric material is an organic polymeric material such as epoxy, molding compound, polyimide, resin or the like.

In some embodiments, a sidewall 102*a* of the capping member 102 is complementary with the sidewall 101*p* of the substrate 101*a*. The sidewall 102*a* of the capping member 102 includes several protrusions 102*b* disposed within the recesses 101*q* of the substrate 101*a* correspondingly. The protrusions 102*b* are complementary with the recesses 101*q*. Since the sidewall 101*p* of the substrate 101*a* has the recesses 101*q* complementary with the protrusions 102*b* of the capping member 102, contact surface between the substrate 101*a* and the capping member 102 is increased or improved. Therefore, an adhesion between the substrate 101*a* and the capping member 102 is increased or improved. Delamination of the capping member 102 from the die structure 101 is minimized or avoided.

Figure 18:
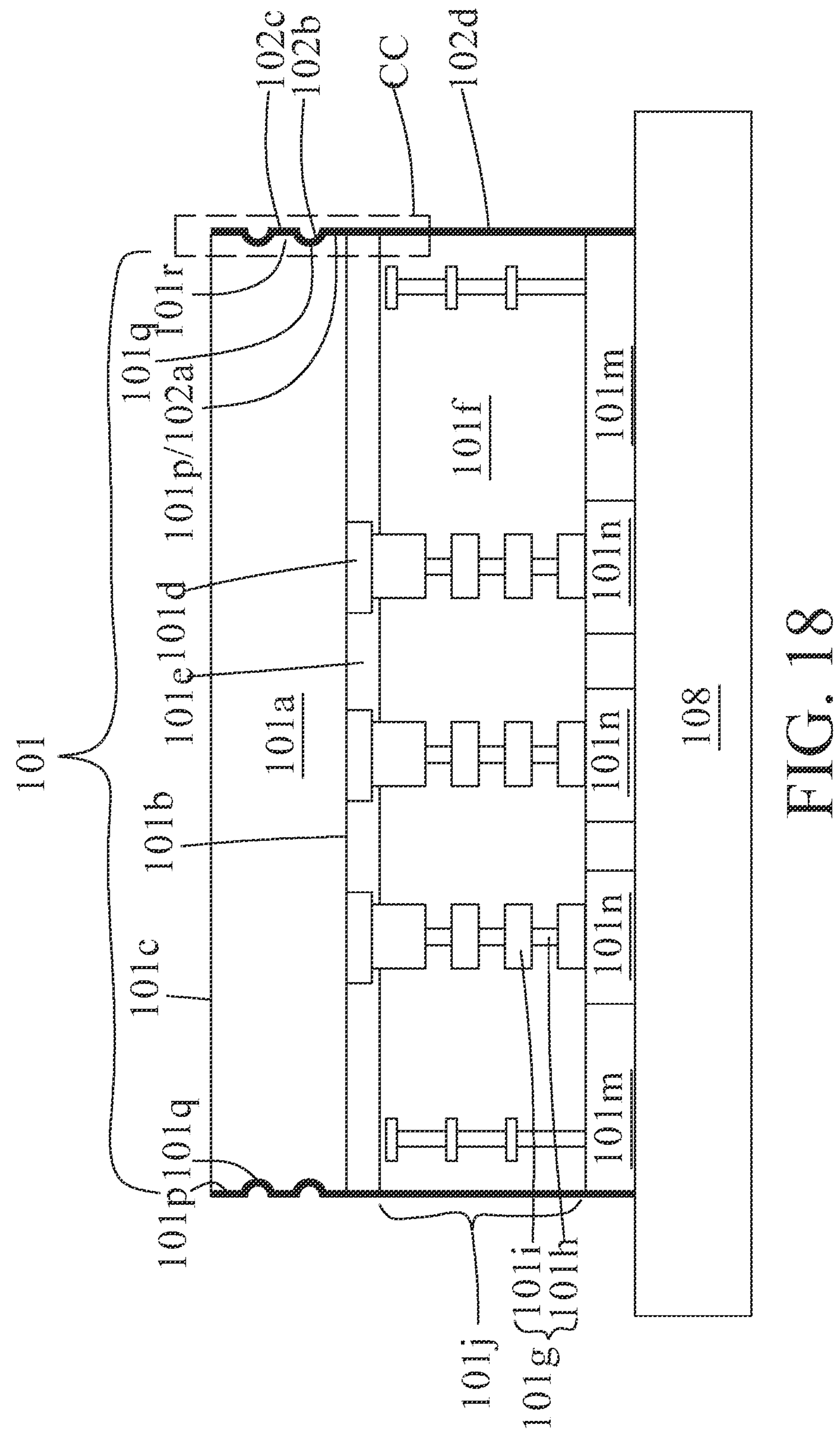
Figure 19:
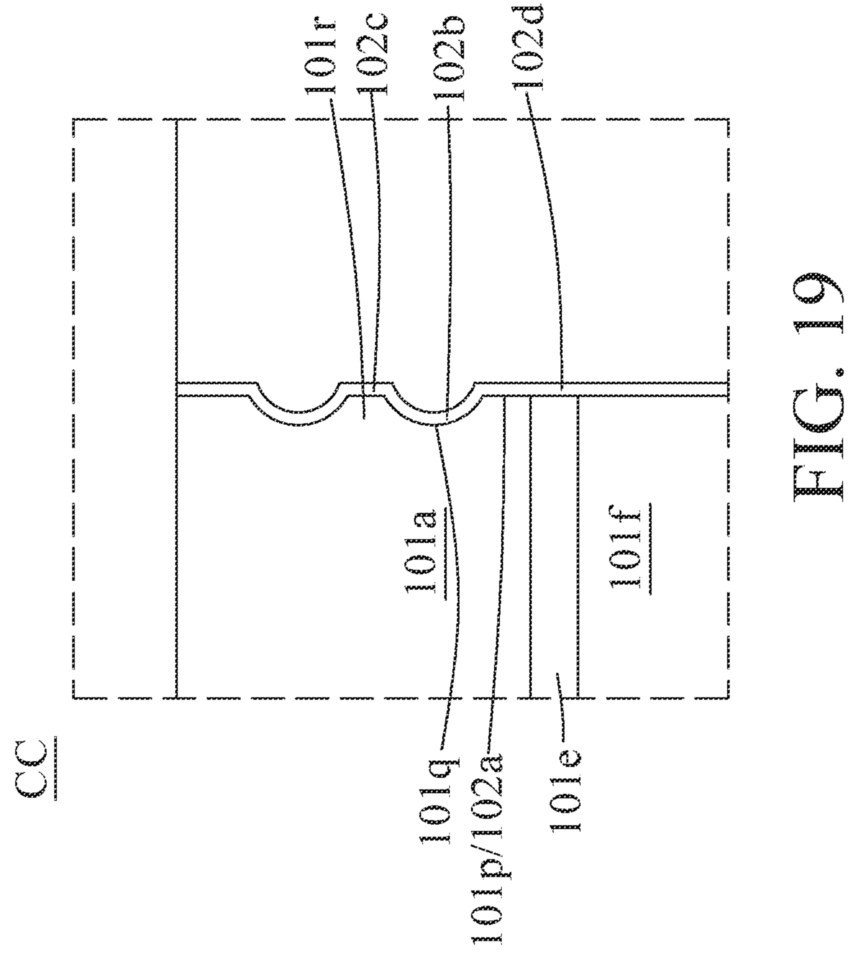
Figure 21:
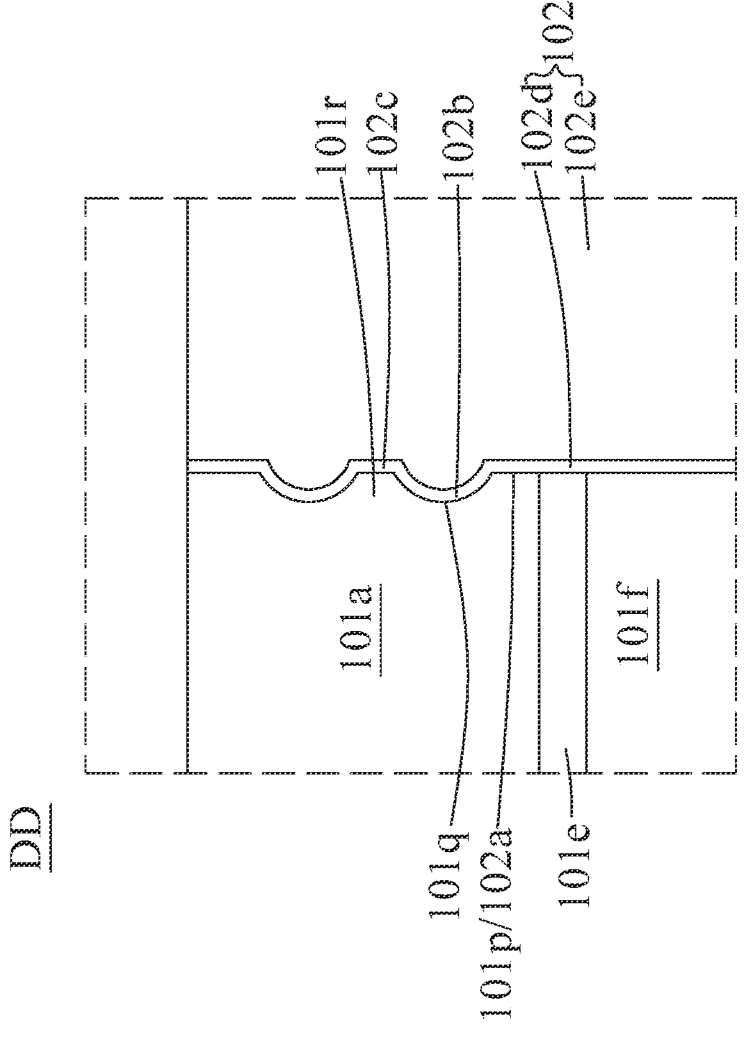

In some embodiments, the capping member 102 is formed by disposing a first polymeric material 102*d* conformal to the sidewall 101*p* of the substrate 101*a* as shown in FIG. 18, and disposing a second polymeric material 102*e* conformal to the first polymeric material 102*d* and within the recesses 101*q* as shown in FIG. 20. FIG. 19 is an enlarged view of a portion CC in FIG. 18, and FIG. 21 is an enlarged view of a portion DD in FIG. 20. In some embodiments, a fluidity of the first polymeric material 102*d* is substantially greater than a fluidity of the second polymeric material 102*e*. In some embodiments, a molecular chain length of the first polymeric material 102*d* is substantially less than a molecular chain length of the second polymeric material 102*e*. In some embodiments, a ratio of carbon to fluorine of the first polymeric material 102*d* is different from a ratio of carbon to fluorine of the second polymeric material 102*e*.

In some embodiments, the first polymeric material 102*d* is disposed over the second surface 101*c* of the substrate 101*a*, along the sidewall 101*p* of the substrate 101*a*, and conformal to the recesses 101*q*. After the disposing of the first polymeric material 102*d*, the second polymeric material 102*e* is disposed over and surrounding the first polymeric material 102*d*. The second polymeric material 102*e* is also disposed over the second surface 101*c* of the substrate 101*a*.

In some embodiments, after the disposing of the first polymeric material 102*d* and the second polymeric material 102*e*, some portions of the first polymeric material 102*d* and the second polymeric material 102*e* disposed over the second surface 101*c* of the substrate 101*a* are removed by planarization or any other suitable operations. In some embodiments, the first polymeric material 102*d* and the second polymeric material 102*e* have similar configurations as the first layer 102*d* and the second layer 102*e* illustrated in any one of FIGS. 1 to 4 and discussed above.

Figure 22:
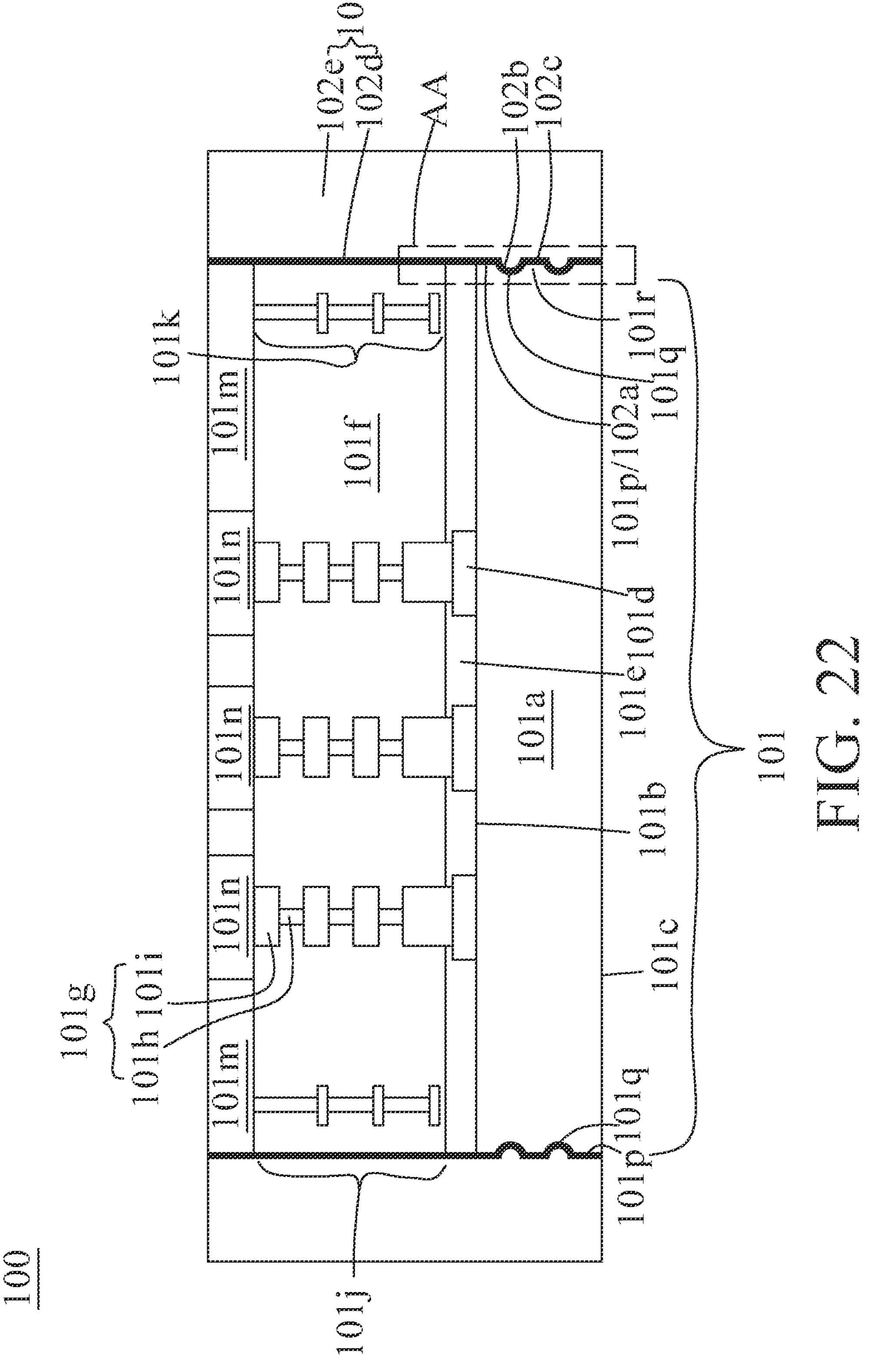

After the formation of the capping member 102, the die structure 101 and the capping member 102 are detached from the carrier substrate 108 as shown in FIG. 22. A first semiconductor structure 100 as shown in FIG. 22 is formed, which is similar to the one illustrated in FIG. 1.

Figure 23:
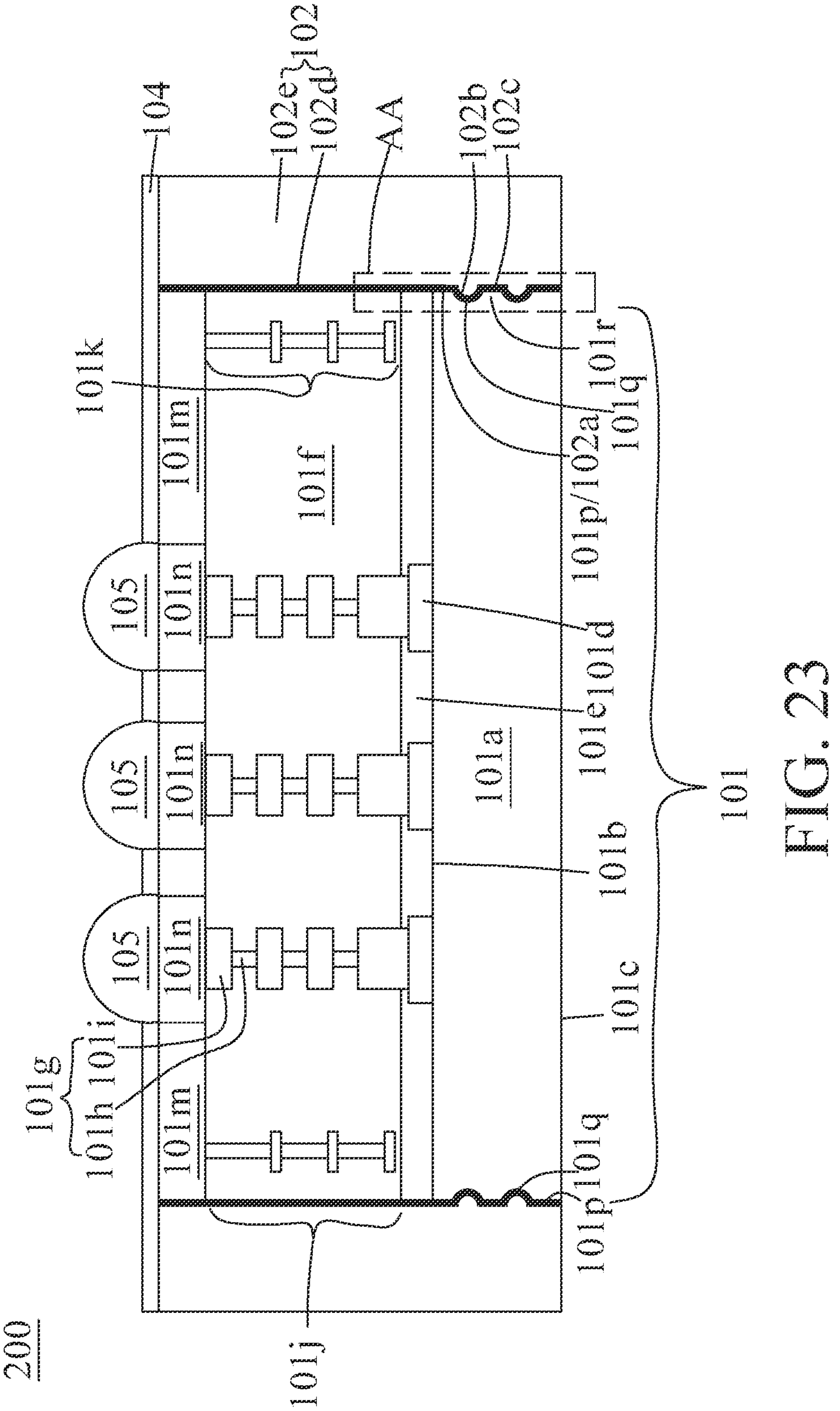

In some embodiments, a conductive bump 105 is disposed on the bonding pad 101*n* as shown in FIG. 23. The conductive bump 105 is disposed by electroplating, solder pasting, ball placement or any other suitable operations. A second semiconductor structure 200 as shown in FIG. 23 is formed, which is similar to the one illustrated in FIG. 2.

Figure 24:
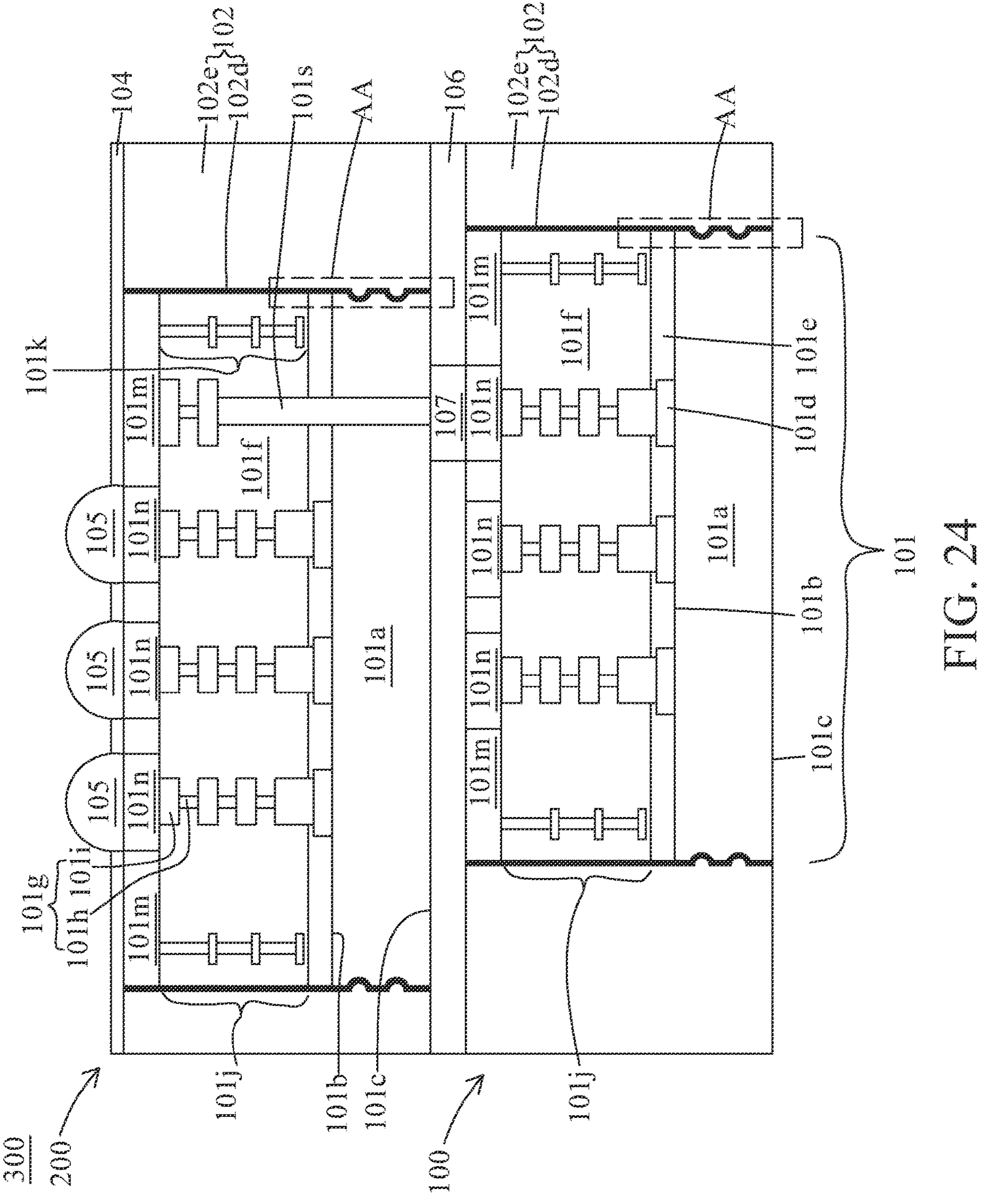
Figure 25:
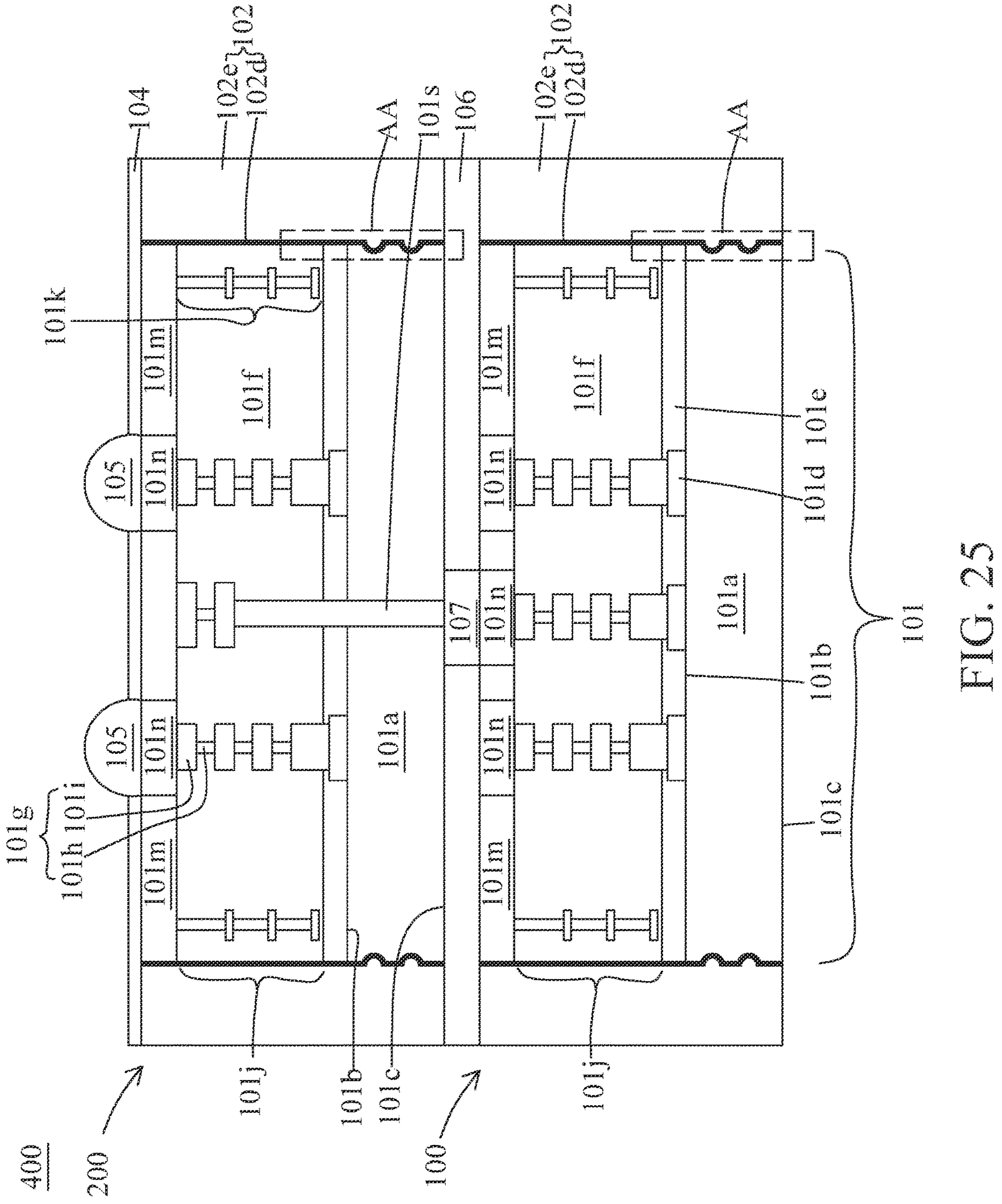

In some embodiments, after the formation of the first semiconductor structure 100 as shown in FIG. 22, the operations 501 to 506 are repeatedly implemented to form another semiconductor structure similar to the first semiconductor structure 100. After the formation of the another semiconductor structure, the another semiconductor structure is bonded over the first semiconductor structure 100 by hybrid bonding or the like to form a third semiconductor structure 300 as shown in FIG. 24 or a fourth semiconductor structure 400 as shown in FIG. 25.

In some embodiments, the hybrid bonding is formed by bonding the bonding dielectric 101*m* with a second bonding dielectric 106, and bonding the bonding pad 101*n* with a second bonding pad 107. In some embodiments, the second bonding dielectric 106 is disposed between the capping members 102 of the first semiconductor structure 100 and the another semiconductor structure. The third semiconductor structure 300 is similar to the one illustrated in FIG. 3. The fourth semiconductor structure 400 is similar to the one illustrated in FIG. 4.

One aspect of this disclosure relates to a semiconductor structure. The semiconductor structure includes a die structure including: a substrate having a sidewall; a dielectric disposed over the substrate; an interconnect structure disposed within the dielectric; and a capping member surrounding the die structure, wherein the sidewall of the substrate includes a plurality of recesses extending into the substrate, and each of the plurality of recesses surrounds at least a portion of the capping member.

In some embodiments, the capping member includes a plurality of protrusions complementary with the plurality of recesses of the sidewall of the substrate respectively. In some embodiments, the plurality of protrusions of the capping member are spaced apart from each other in a distance of substantially greater than 0.1 um. In some embodiments, the sidewall of the substrate includes a plurality of protrusions alternately disposed with the plurality of recesses. In some embodiments, each of the plurality of recesses has a depth of substantially greater than 0.5 um, and has a width of substantially greater than 0.1 um.

In some embodiments, the capping member includes organic polymeric material. In some embodiments, the capping member includes a first layer contacting the die structure, and a second layer conformal to the first layer. In some embodiments, the first layer is conformal to the entire sidewall of the substrate. In some embodiments, the die structure further includes: a bonding dielectric disposed over the dielectric of the die structure and surrounded by the capping member; and a bonding pad disposed over the dielectric of the die structure, coupled with the interconnect structure, and surrounded by the bonding dielectric. In some embodiments, the capping member is in contact with the bonding dielectric, the dielectric and the substrate.

One aspect of this disclosure relates to a semiconductor structure. The semiconductor structure includes a die structure including: a substrate having a first surface, a second surface opposite to the first surface, and a sidewall extending between the first surface and the second surface; a dielectric disposed over the first surface of the substrate; an interconnect structure disposed within the dielectric; and a capping member surrounding the die structure, wherein an interior angle between the first surface and the sidewall of the substrate is an obtuse angle or an acute angle.

In some embodiments, the sidewall of the substrate is a slanted sidewall. In some embodiments, the sidewall of the substrate is convex sidewall or concave sidewall. In some embodiments, the substrate is protruded into the capping member. In some embodiments, the capping member is protruded into the substrate.

An aspect of this disclosure relates to a method of manufacturing a semiconductor structure. The method includes providing a substrate; disposing a dielectric over the substrate; forming an interconnect structure within the dielectric; sawing the substrate and the dielectric to form a die structure; placing the die structure on a carrier substrate; forming a capping member surrounding the die structure, wherein the sawing of the substrate includes forming a sidewall of the substrate having a plurality of recesses extending into the substrate.

In some embodiments, the formation of the capping member includes disposing a first polymeric material conformal to the sidewall of the substrate, and disposing a second polymeric material conformal to the first polymeric material and within the plurality of recesses. In some embodiments, a fluidity of the first polymeric material is substantially greater than a fluidity of the second polymeric material. In some embodiments, the plurality of recesses are formed by deep reactive ion etching (DRIE) operation. In some embodiments, the sawing of the dielectric is prior to the sawing of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a die structure including:

a substrate having a first sidewall and a first surface coupled to and substantially orthogonal to the first sidewall;

a dielectric disposed over the substrate and having a second sidewall coupled to the first sidewall and the first surface and substantially coplanar with the first sidewall;

an interconnect structure disposed within the dielectric; and a capping member surrounding the die structure, wherein the first sidewall of the substrate includes a plurality of recesses extending into the substrate, each of the plurality of recesses surrounds at least a portion of the capping member, and the capping member contacts the first sidewall and the second sidewall.

2. The semiconductor structure of claim 1, wherein the capping member includes a plurality of protrusions complementary with the plurality of recesses of the sidewall of the substrate respectively.

3. The semiconductor structure of claim 2, wherein the plurality of protrusions of the capping member are spaced apart from each other in a distance of substantially greater than 0.1 um.

4. The semiconductor structure of claim 1, wherein the first sidewall of the substrate includes a plurality of protrusions alternately disposed with the plurality of recesses.

5. The semiconductor structure of claim 1, wherein each of the plurality of recesses has a depth of substantially greater than 0.5 um, and has a width of substantially greater than 0.1 um.

6. The semiconductor structure of claim 1, wherein the capping member includes organic polymeric material.

7. The semiconductor structure of claim 1, wherein the capping member includes a first layer contacting the die structure, and a second layer conformal to the first layer.

8. The semiconductor structure of claim 6, wherein the first layer is conformal to the entire first sidewall of the substrate.

9. The semiconductor structure of claim 1, wherein the die structure further includes:

a bonding dielectric disposed over the dielectric of the die structure and surrounded by the capping member; and a bonding pad disposed over the dielectric of the die structure, coupled with the interconnect structure, and surrounded by the bonding dielectric.

10. The semiconductor structure of claim 9, wherein the capping member is in contact with the bonding dielectric, the dielectric and the substrate.

11. A semiconductor structure, comprising:

a die structure including:

a substrate having a first surface, a second surface opposite to the first surface, and a first sidewall extending between the first surface and the second surface;

a dielectric disposed over the first surface of the substrate and having a second sidewall;

an interconnect structure disposed within the dielectric; and a capping member surrounding the die structure, wherein a first interior angle between the first surface and the first sidewall of the substrate is an obtuse angle or an acute angle, wherein a second interior angle between the first surface and the second sidewall is different from the first interior angle, and the first sidewall is not in parallel to the second sidewall.

12. The semiconductor structure of claim 11, wherein the sidewall of the substrate is a slanted sidewall.

13. The semiconductor structure of claim 11, wherein the sidewall of the substrate is convex sidewall or concave sidewall.

14. The semiconductor structure of claim 11, wherein the substrate is protruded into the capping member.

15. The semiconductor structure of claim 11, wherein the capping member is protruded into the substrate.

16. A semiconductor structure, comprising:

a die structure including:

a substrate;

a dielectric disposed over the substrate; and an interconnect structure surrounded by the dielectric; and a capping member in contact with the die structure, wherein the capping member includes a first layer at least partially extending into a plurality of recesses indented into a sidewall of the substrate, and a second layer conformal to the first layer, the plurality of recesses surround at least a portion of the second layer of the capping member, and the second layer is separated from the substrate and the dielectric by the first layer.

17. The semiconductor structure of claim 16, wherein the plurality of recesses are spaced from each other in a distance substantially greater than 0.1 um.

18. The semiconductor structure of claim 16, further comprising a die pad between the substrate and the dielectric and electrically connected to the interconnect structure.

19. The semiconductor structure of claim 16, wherein a ratio of carbon to fluorine of the first layer is different from a ratio of carbon to fluorine of the second layer.

20. The semiconductor structure of claim 16, wherein the capping member includes a plurality of protrusions complementary with the plurality of recesses of the substrate.

* * * * *